(12) United States Patent
Nagase et al.

(10) Patent No.: US 9,059,165 B2
(45) Date of Patent: Jun. 16, 2015

(54) SEMICONDUCTOR DEVICE HAVING MESH-PATTERN WIRINGS

(71) Applicant: PS4 Luxco S.a.r.l., Luxembourg (LU)

(72) Inventors: Shuichi Nagase, Tokyo (JP); Hisayuki Nagamine, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/800,782

(22) Filed: Mar. 13, 2013

(65) Prior Publication Data

US 2013/0285258 A1  Oct. 31, 2013

(30) Foreign Application Priority Data

Apr. 26, 2012 (JP) ................. 2012-100976

(51) Int. Cl.
*H01L 23/522* (2006.01)
*H01L 23/528* (2006.01)
*H01L 27/118* (2006.01)
*H01L 27/02* (2006.01)

(52) U.S. Cl.
CPC ........ *H01L 23/5221* (2013.01); *H01L 23/5226* (2013.01); *H01L 23/5286* (2013.01); *H01L 27/0207* (2013.01); *H01L 27/11807* (2013.01); *H01L 2924/0002* (2013.01)

(58) Field of Classification Search
CPC ............ G06F 17/5077; H01L 23/5225; H01L 23/528; G11C 5/025; G11C 5/063
USPC ..................... 257/508, 662; 365/21
See application file for complete search history.

(56) References Cited

U.S. PATENT DOCUMENTS

2001/0013422 A1* 8/2001 Schaper ................. 174/250

FOREIGN PATENT DOCUMENTS

JP  2001-127162 A  5/2001

* cited by examiner

*Primary Examiner* — Thomas L Dickey

(57) ABSTRACT

Disclosed herein is a device that includes: first lines formed on a first wiring layer extending in a first direction; second lines formed on a second wiring layer extending in a second direction; and conductor plugs connecting the first lines to the second lines such that the first and second lines form a mesh-structure wiring. The first lines include first enlarged portions at intersection positions where the first and second lines cross to each other, a width in the second direction of the first enlarged portions is wider than a line width of the first lines at other than the intersection position. The second lines include second enlarged portions at the intersection positions, a width in the first direction of the second enlarged portions is wider than a line width of the second lines at other than the intersection position.

20 Claims, 31 Drawing Sheets

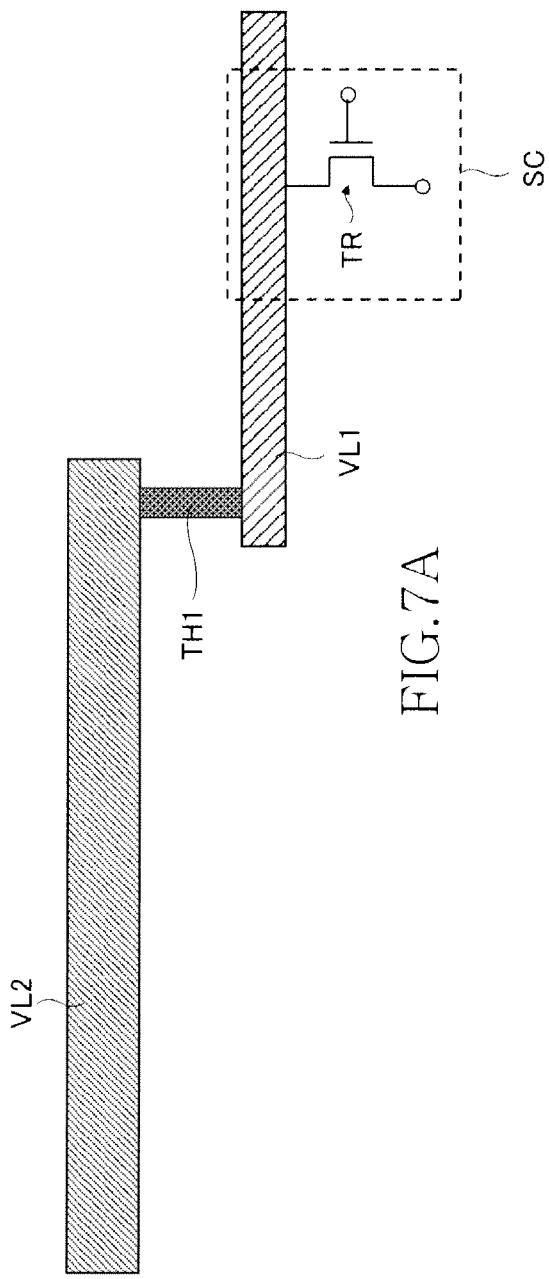
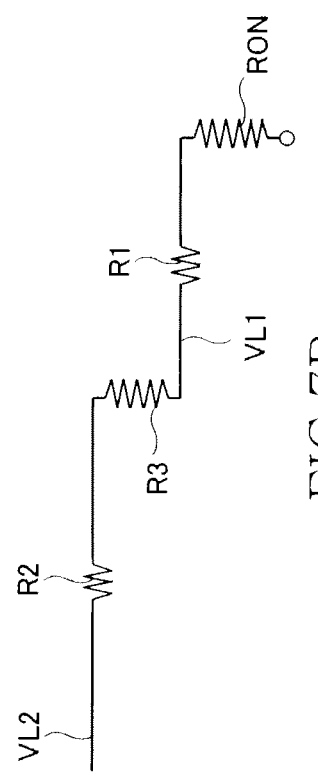
FIG.7A
FIG.7B

US 9,059,165 B2

SEMICONDUCTOR DEVICE HAVING MESH-PATTERN WIRINGS

This application claims priority to Japanese patent application No. 2012-100976, filed Apr. 26, 2012, the entire contents of which is incorporated herein by reference.

BACKGROUND OF THE INVENTION

1. Field of the Invention

The present invention relates to a semiconductor device and a layout method thereof, and more particularly to a semiconductor device equipped with mesh-pattern wirings, and a layout method thereof.

2. Description of Related Art

A typical semiconductor device includes a plurality of wiring layers. On each of the wiring layers, power-supply lines and signal lines are formed. For example, what is disclosed in Japanese Patent Application Laid-Open No. 2001-127162 is a structure in which a plurality of power-supply lines that extend in an X-direction are formed on a certain wiring layer, and a plurality of power-supply lines that extend in a Y-direction on another wiring layer, and the power-supply lines are connected through conductor plugs. In this manner, the power-supply lines are formed in a mesh pattern.

It is preferred that the electrical resistance of the power-supply lines that are formed in a mesh pattern be as low as possible. The reason is that, if the electrical resistance of the power-supply lines is high, a power-supply voltage that is supplied to circuit elements becomes lower due to a voltage drop. In recent years, an external power-supply voltage tends to be made lower. Therefore, it is very important to lower the resistance of the power-supply lines.

However, as microfabrication technology has advanced in recent years, the wiring width of the power-supply lines tends to be reduced. Accordingly, the electrical resistance of the power-supply lines formed in a mesh pattern tends to become higher. A technique for keeping the electrical resistance low is desired. Such demand is noticeable particularly in the field of power-supply lines. However, the same is true not only in the field of power-supply lines, but also in the field of other lines such as signal lines.

SUMMARY

In one embodiment, there is provided a semiconductor device that includes: a first wiring layer defined on a main surface of a semiconductor substrate; a second wiring layer defined above the first wiring layer; an interlayer insulation layer formed between the first and second wiring layers; first and second lines extending along to each other in a first direction on the first wiring layer; third and fourth lines extending along to each other in a second direction crossing the first direction on the second wiring layer; and a conductor plug penetrating through the interlayer insulation film. The first line includes a first intersection region that overlaps with the third line and a first non-intersection region that does not overlap with the third line. The third line includes a second intersection region that overlaps with the first line and a second non-intersection region that does not overlap with the first line. The conductor plug is disposed between the first and second intersection regions. A distance between the first intersection region and the second line is smaller than a distance between the first non-intersection region and the second line. A distance between the second intersection region and the fourth line is smaller than a distance between the second non-intersection region and the fourth line.

In another embodiment, there is provided a semiconductor device that includes: a plurality of first lines formed on a first wiring layer extending in a first direction; a plurality of second lines formed on a second wiring layer extending in a second direction that crosses the first direction; and a plurality of conductor plugs each connecting an associated one of the first lines to an associated one of the second lines such that the first and second lines form a mesh-structure wiring. The first lines include first enlarged portions at intersection positions where the first and second lines cross to each other, a width in the second direction of the first enlarged portions is wider than a line width of the first lines at other than the intersection position. The second lines include second enlarged portions at the intersection positions, a width in the first direction of the second enlarged portions is wider than a line width of the second lines at other than the intersection position.

In still another embodiment, there is provided a semiconductor device that includes: a plurality of first lines formed on a first wiring layer extending in a first direction; a plurality of second lines formed on a second wiring layer extending in a second direction that crosses the first direction; and a plurality of conductor plugs each connecting an associated one of the first lines to an associated one of the second lines such that the first and second lines form a mesh-structure wiring. The first lines include a first polygonal portion that is formed into a polygon having five or more sides at intersection positions where the first and second lines cross to each other.

According to the present invention, even when the line width is small, the sufficient areas of intersection regions are secured. Therefore, the resistance components of conductor plugs can be reduced. In this manner, it is possible to lower the electrical resistance of wirings that are formed in a mesh pattern.

BRIEF DESCRIPTION OF THE DRAWINGS

FIG. 7A is diagrams showing a wiring route from a power-supply main line VL2 to a transistor TR;

FIG. 7B is a diagram showing an equivalent circuit shown in FIG. 7A;

DETAILED DESCRIPTION OF THE EMBODIMENTS

Before an explanation of embodiments of the present invention is given, the matters that had been examined in advance by the present inventors will be described with reference to FIGS. 1 to 9.

Figure 1:
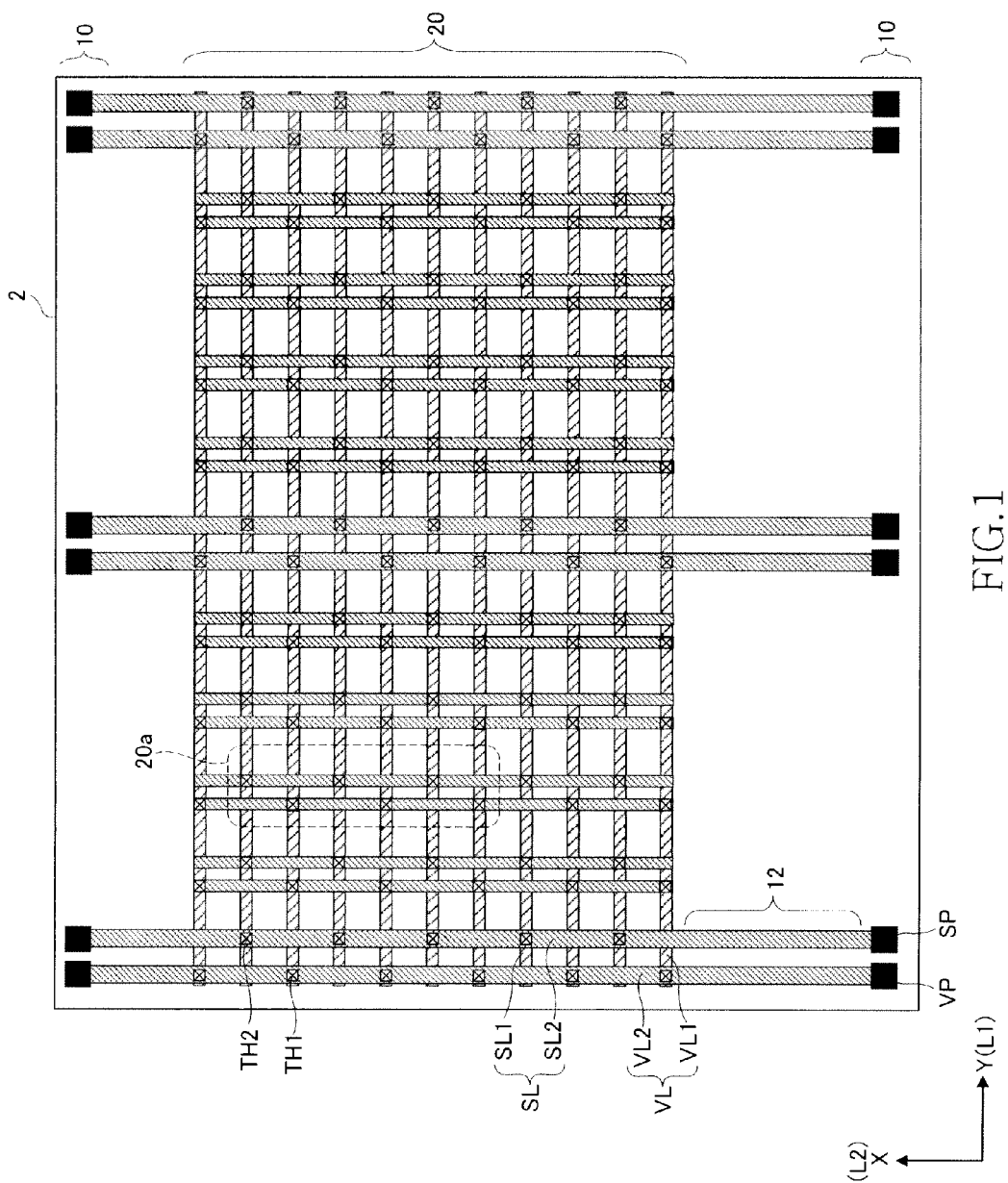
FIG. 1 is a schematic plane view of a semiconductor device having power-supply lines that are formed in a mesh pattern.

The semiconductor device 2 shown in FIG. 1 is made up of a single silicon chip, and includes pad regions 10 and a logic circuit formation region 20. Power-supply main lines VL and SL, which are connected to the pad regions 10, are formed in a mesh pattern in the logic circuit formation region 20. More specifically, the pad regions 10 are provided near sides of the chip that extend in a Y-direction. The pad regions include power-supply pads VP, to which an external power-supply potential VDD is supplied, and power-supply pads SP, to which a ground potential VSS is supplied. To the power-supply pads VP, the power-supply main lines VL are connected. To the power-supply pads SP, the power-supply main lines SL are connected.

In the logic circuit formation region 20, wiring layers L1 and L2 are provided. The wiring layer L1 is a relatively lower wiring layer. On the wiring layer L1, power-supply main lines VL1 and SL1 that extend in the Y-direction are provided. The wiring layer L2 is a relatively upper wiring layer. On the wiring layer L2, power-supply main lines VL2 and SL2 that extend in an X-direction are provided. In intersection regions of the power-supply main lines VL1, which extend in the Y-direction, and the power-supply main lines VL2, which extend in the X-direction, conductor plugs TH1 are provided. Therefore, the power-supply main lines VL1 and the power-supply main lines VL2 are short-circuited. In this manner, the power-supply main lines VL are formed in a mesh pattern with the use of the wiring layers L1 and L2. Similarly, in intersection regions of the power-supply main lines SL1, which extend in the Y-direction, and the power-supply main lines SL2, which extend in the X-direction, conductor plugs TH2 are provided. Therefore, the power-supply main lines SL1 and the power-supply main lines SL2 are short-circuited. In this manner, the power-supply main lines SL are formed in a mesh pattern with the use of the wiring layers L1 and L2.

Figure 2:
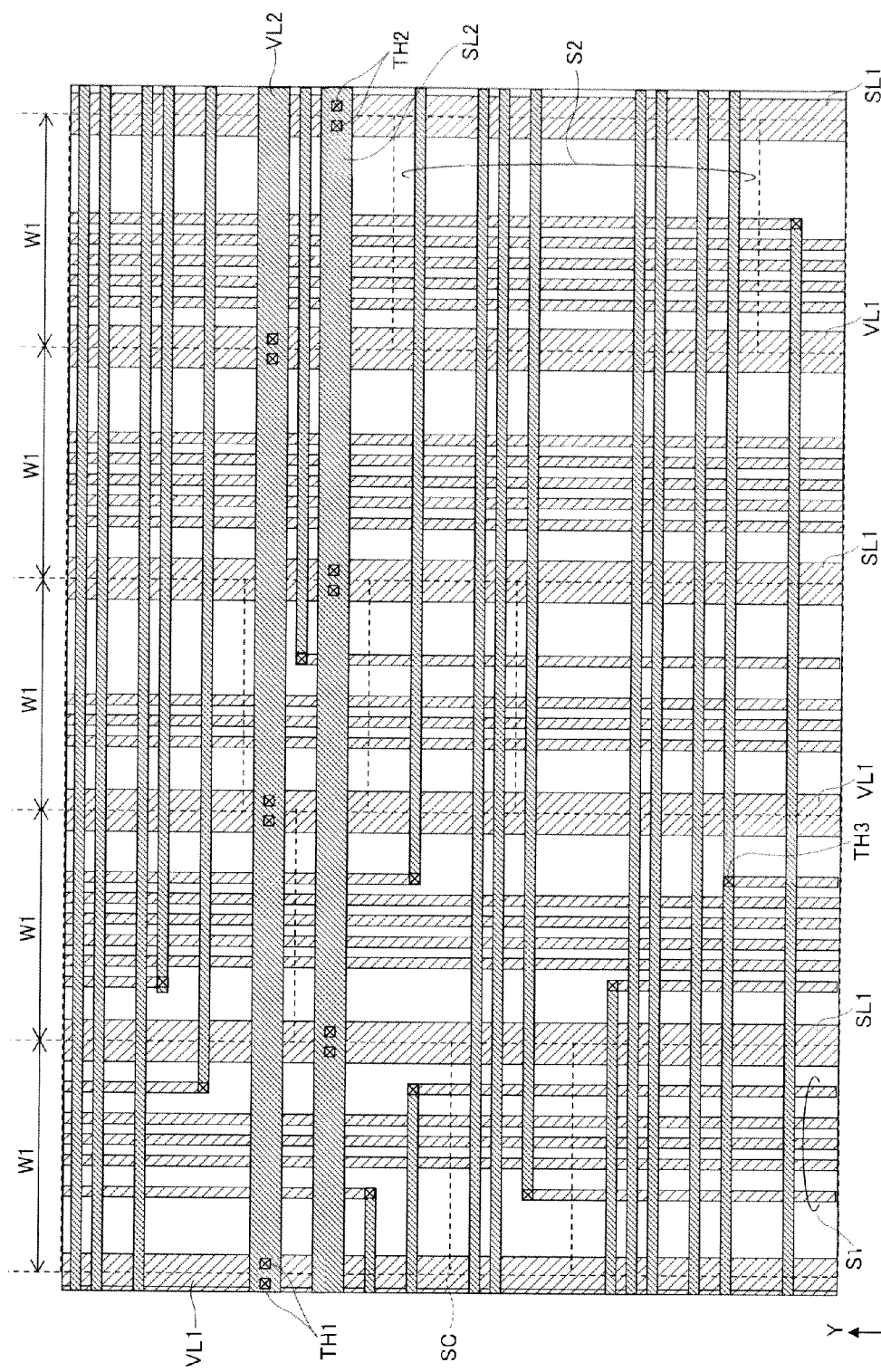
FIG. 2 is a schematic enlarged plane view of a region 20a shown in FIG. 1.

Turning to FIG. 2, a plurality of standard cells SC are formed on a semiconductor substrate. The cell boundaries of the standard cells SC are indicated by dashed line in FIG. 2. The standard cells SC are circuit blocks that are designed to realize a predetermined function by using several to dozens of basic logic gate circuits such as NAND gate circuits and NOR gate circuits. The functionality and layout of the standard cells SC are registered with a library in advance. Therefore, during a process of designing the semiconductor device 2, required standard cells SC are selected from the library, and a layout process is carried out by arranging a plurality of standard cells SC selected.

The X-direction width W1 of the standard cells SC is constant. Therefore, on a track (cell shelf) that extends in the Y-direction, a plurality of standard cells SC with a constant width are arranged. The Y-direction length of the standard cells SC varies according to the type of the standard cells SC.

In that manner, the X-direction width of the standard cells SC is constant. Therefore, the cell boundaries, which extend in the Y-direction, appear repeatedly in the direction at regular intervals. As shown in FIG. 2, on the boundaries, the power-supply main lines VL1 and SL1 are alternately disposed. According to the above-described layout, in any standard cell SC, on one X-direction side, a power-supply main line VL1 extends in the Y-direction; on the other X-direction side, a power-supply main line SL1 extends in the Y-direction. Therefore, the power-supply main lines VL1 and SL1 can be shared among the standard cells SC that are adjacent to each other in the X-direction. Thus, an efficient wiring layout is possible.

As shown in FIG. 2, a plurality of signal lines S1 and S2 are provided between the adjacent power-supply main lines. More specifically, between the power-supply main lines VL1 and SL1 formed on the wiring layer L1, a plurality of signal lines S1 are so provided as to extend in the Y-direction. Between the power-supply main lines VL2 and SL2 formed on the wiring layer L2, a plurality of signal lines S2 are so provided as to extend in the X-direction. The line width of the signal lines S1 is smaller than those of the power-supply main lines VL1 and SL1. For example, the line width of the signal lines S1 is so designed as to be a minimum line width on the wiring layer L1. Similarly, the line width of the signal lines S2 is smaller than those of the power-supply main lines VL2 and SL2. For example, the line width of the signal lines 52 is so designed as to be a minimum line width on the wiring layer L2. The reason is that the signal lines S1 and S2 need to be designed to have the minimum line widths to allow a larger number of wirings to be laid out, and that the power-supply main lines VL and SL need to be designed to have wider line widths to lower the resistance.

Among the signal lines S1 formed on the wiring layer L1 and the signal lines S2 formed on the wiring layer L2, the wirings that are used for transmitting the same signals are short-circuited via conductor plugs TH3. As shown in FIG. 2, the signal lines S1 and S2 are designed to have the minimum line widths. Therefore, only one conductor plug TH3 can be formed in each intersection region. On the other hand, the power-supply main lines VL and SL are wider in line width. Therefore, a plurality of conductor plugs TH1 or TH2 are formed in each intersection region.

Figure 3:
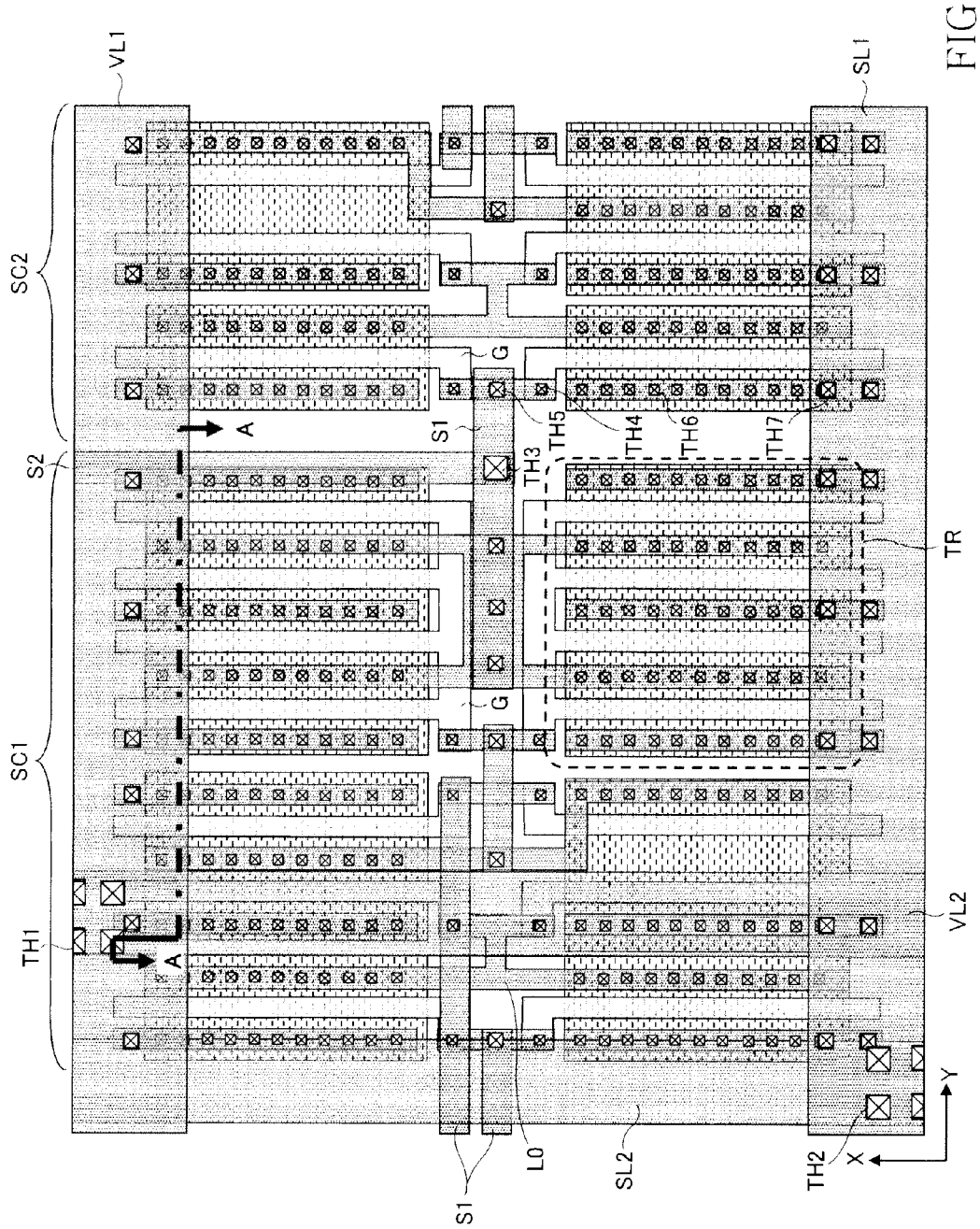
FIG. 3 is a perspective plane view showing one example of a layout pattern of the standard cells SC1 and SC2 shown in FIG. 2.
Figure 4:
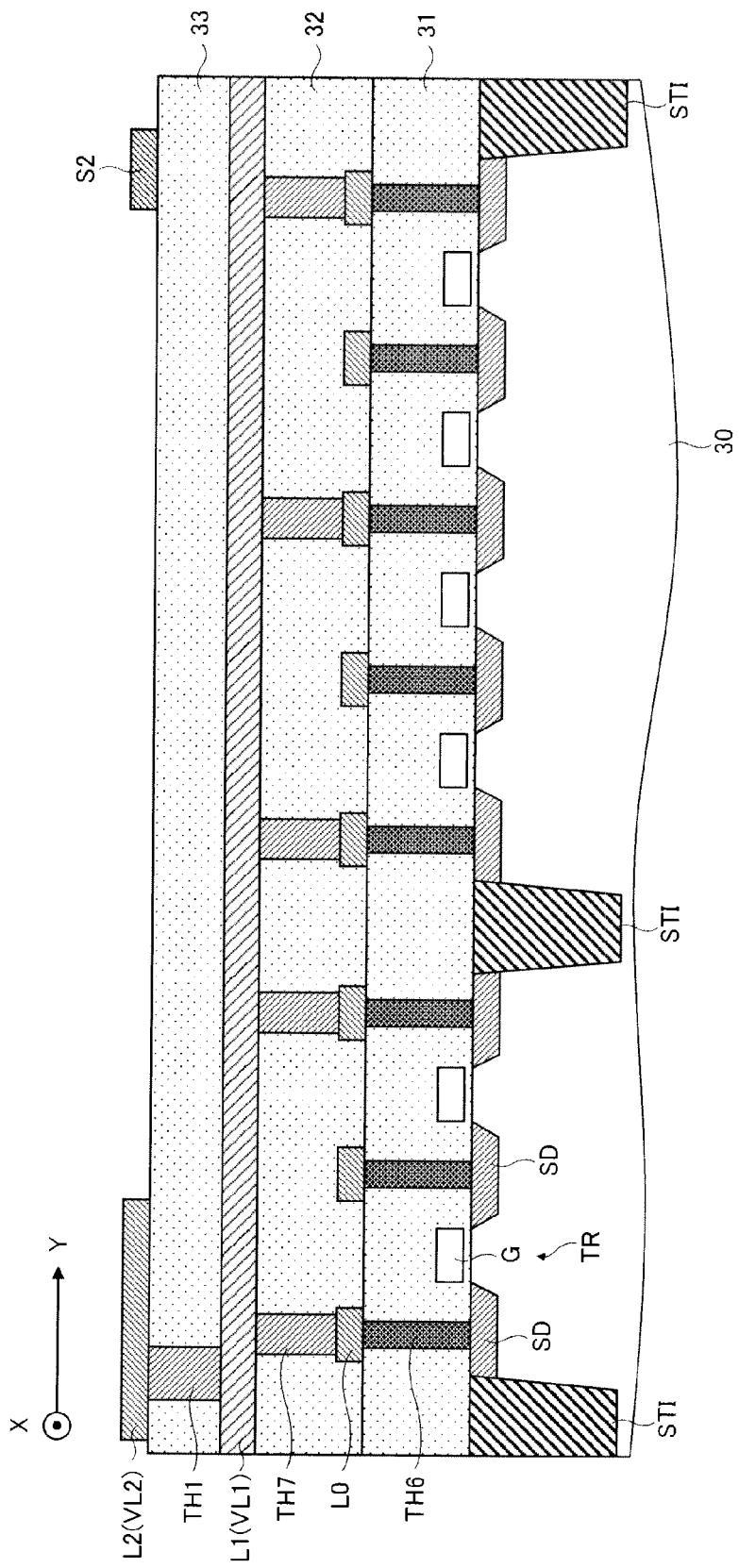
FIG. 4 is a schematic cross-sectional view of FIG. 3 taken along line A-A.

Turning to FIG. 3, standard cells SC1 and SC2 are disposed adjacent to each other in the Y-direction. The X-direction width of the standard cell S1 is equal to that of the standard cell S2. The standard cells SC1 and SC2 each include a source/drain region SD, which is defined by element isolation regions ST1 and which is provided on a semiconductor substrate 30; a gate wiring layer G, which is provided above the semiconductor substrate 30; and a wiring layer L0, which is provided above the gate wiring layer G. A portion of a gate wiring layer G that is provided between the two source/drain regions SD on the semiconductor substrate 30 functions as a gate electrode of a transistor TR. For example, the gate wiring layers G are made of poly-silicon, and are used as the bottom wiring layers as shown in FIG. 4. For example, the wiring layers L0 are made of tungsten, and are used as wiring layers that are positioned immediately above the gate wiring layers G as shown in FIG. 4.

The gate wiring layers G are connected to a wiring pattern provided on the wiring layer L0 via conductor plugs TH4. The gate wiring layers G are also connected to the signal lines S1 provided on the wiring layer L1 via conductor plugs TH5. The source/drain regions SD are connected to a wiring pattern provided on the wiring layer L0 via conductor plugs TH6. The source/drain regions SD are also connected to the signal lines S1 or power-supply main lines VL1 and SL1 provided on the wiring layer L1 via conductor plugs TH7. In this manner, the gate wiring layers G and the wiring layers L0 and L1 are mainly used for wiring in the standard cells SC1 and SC2.

The signal lines S1 provided on the wiring layer L1 are also used for connection between the standard cells SC1 and SC2. In the present example, along one X-direction side of the standard cells SC1 and SC2, the power-supply main line VL1 is disposed. Along the other X-direction side, the power-supply main line SL1 is disposed. Therefore, in a region between the power-supply main lines VL1 and SL1, the signal lines S1 can be freely disposed. As shown in FIG. 3, a predetermined signal line S1 is connected to a signal line S2 provided on the wiring layer L2 via a conductor plug TH3. The power-supply main lines VL1 and SL1 are connected to the power-supply main lines VL2 and SL2 provided on the wiring layer L2 via conductor plugs TH1 and TH2.

As shown in FIG. 4, an interlayer insulation film 31 is provided between the gate wiring layer G and the wiring layer L0. The conductor plugs TH4 and TH6 are so provided as to pass through the interlayer insulation film 31. Between the wiring layer L0 and the wiring layer L1, an interlayer insulation film 32 is provided. The conductor plugs TH5 and TH7 are so provided as to pass through the interlayer insulation film 32. Between the wiring layer L1 and the wiring layer L2, an interlayer insulation film 33 is provided. The conductor plugs TH1 to TH3 are so provided as to pass through the interlayer insulation film 33.

Figure 5:
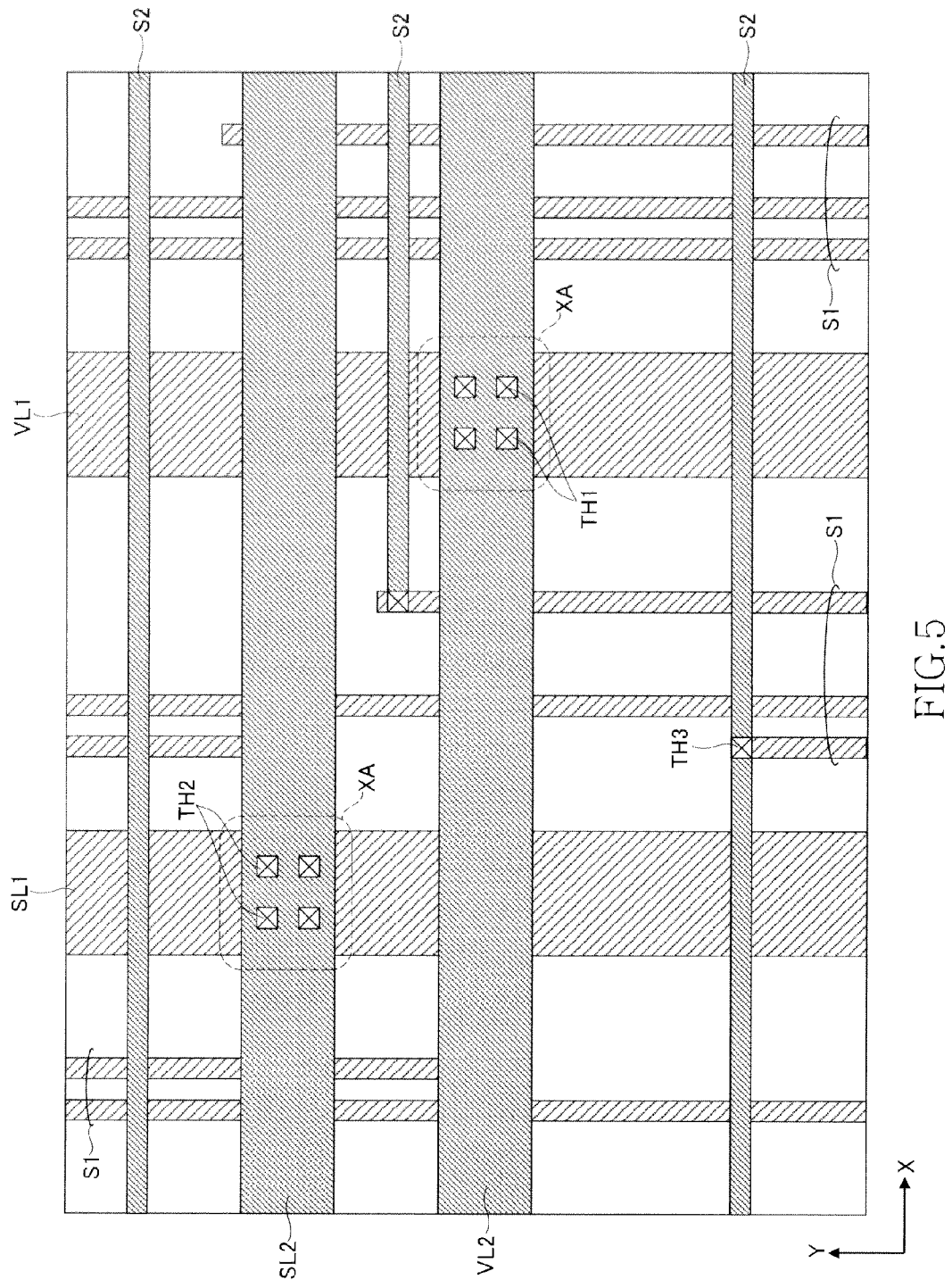
FIG. 5 is a schematic enlarged plane view showing one portion of what is shown in FIG. 2.

In the example shown in FIG. 5, only one conductor plug TH3, which is used to connect the signal lines S1 and S2, is formed in each intersection region. As for the conductor plugs TH1, which are used to connect the power-supply main lines VL1 and VL2, and the conductor plugs TH2, which are used to connect the power-supply main lines SL1 and SL2, four plugs are formed in each intersection region XA. The reason why a plurality of conductor plugs TH1 and TH2 are formed in each intersection region is to reduce the wiring resistance of the power-supply main lines VL and SL that are formed in a mesh pattern.

Figure 6:
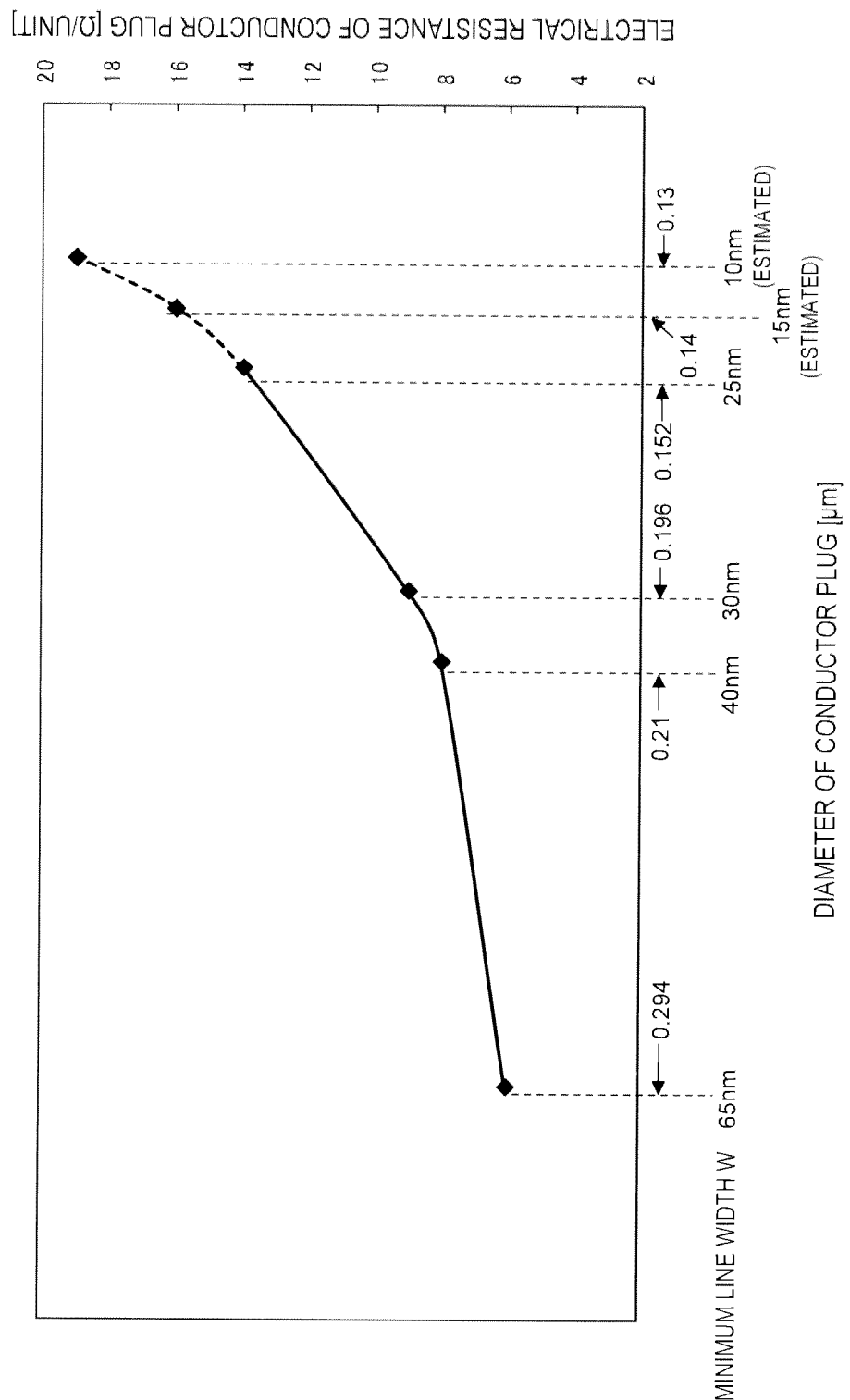
FIG. 6 is a graph illustrating the relation between diameter and electrical resistance of conductor plugs.

In FIG. 6, the horizontal axis represents the diameter of conductor plugs, and the vertical axis represents the electrical resistance of one conductor plug. As shown in FIG. 6, the diameter of conductor plugs is correlated with minimum line width W. For example, in a process where the minimum line width W is 65 nm, the diameter of conductor plugs is about 0.294 μm. As the minimum line width W is reduced to 40 nm, 30 nm, or 25 nm, the diameter of conductor plugs is decreased to 0.21 μm, 0.196 μm, or 0.152 μm. As the diameter of conductor plugs becomes smaller, the electrical resistance rises. In a 25 nm process, the electrical resistance rises to about 14Ω.

With the aim of making chips smaller in size, the minimum line width W is expected to be further reduced to 15 nm or 10 nm. In such a case, the diameter of conductor plugs will be reduced to 0.14 μm or 0.13 μm, too, helping to further increase the electrical resistance.

As shown in FIG. 7A, on the wiring route from the power-supply main line VL2 to the transistor TR, a conductor plug TH1 and a power-supply main line VL1 exist. In this case, the wiring resistances of the power-supply main lines VL1 and VL2 are represented by R1 and R2, respectively, and the plug resistance of the conductor plug TH1 by R3. As shown in FIG. 7B, the resistances R1, R2, and R3 are connected in series to the transistor TR. Accordingly, on the on-resistance RON of the transistor TR, the combined resistances, R1+R2+R3, are superimposed. In general, a parasitic resistance component superimposed on the on-resistance RON needs to be 5 to 10 percent of the on-resistance RON, or less. The parasitic resistance component that exceeds the above range may have unignorable effects on transistor characteristics. In order to obtain desired transistor characteristics, the resistances, R1+R2+R3, need to be decreased.

Figure 8:
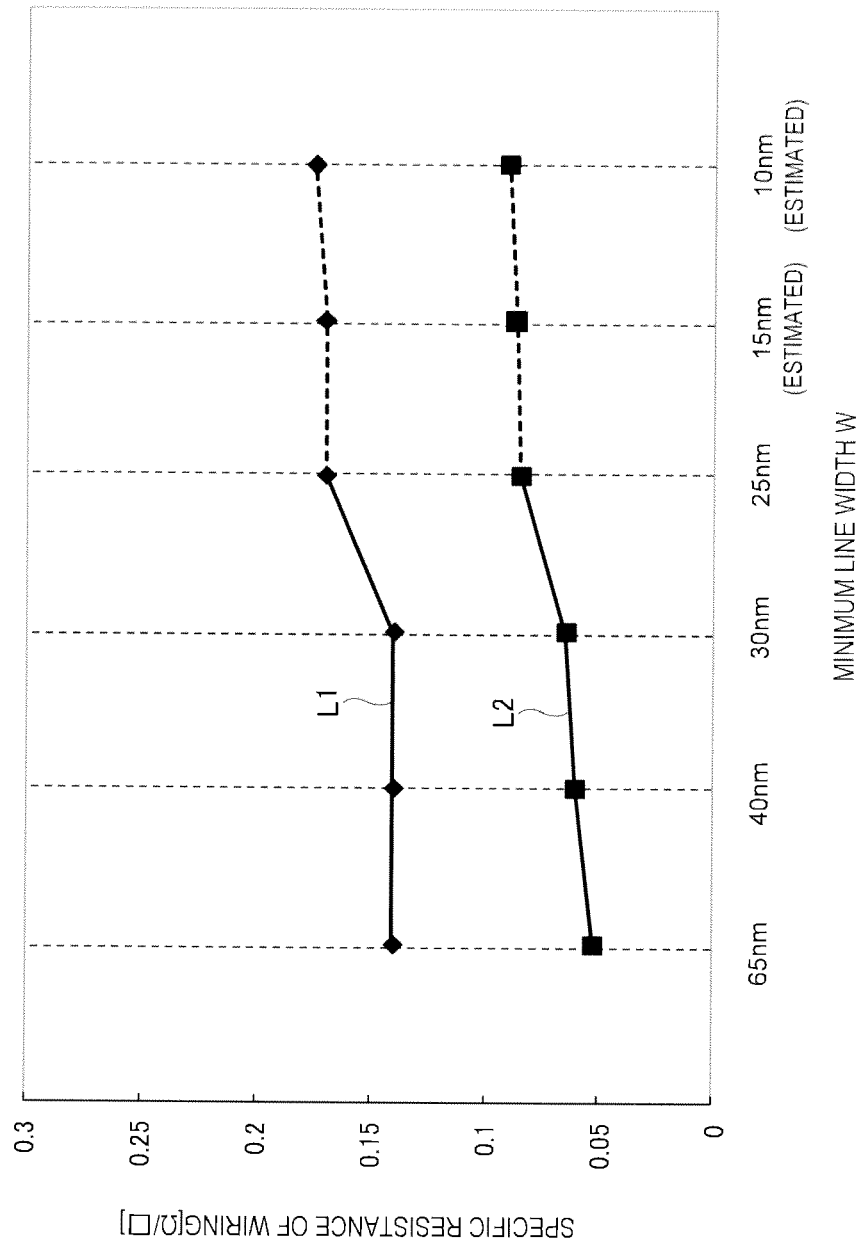
FIG. 8 is a graph showing the relation between minimum line width and specific resistance of wirings (electrical resistance per unit area)

As shown in FIG. 8, as the minimum line width W becomes smaller, the specific resistance of wirings tends to slightly rise. However, the impact that the rise in specific resistance has is small (about 1 percent) compared with the conduct, plugs, meaning that a decrease in the resistance of wirings is less effective in reducing the parasitic resistance component, and that it is much more important to lower the resistance R3 of the conductor plug.

Figure 9:
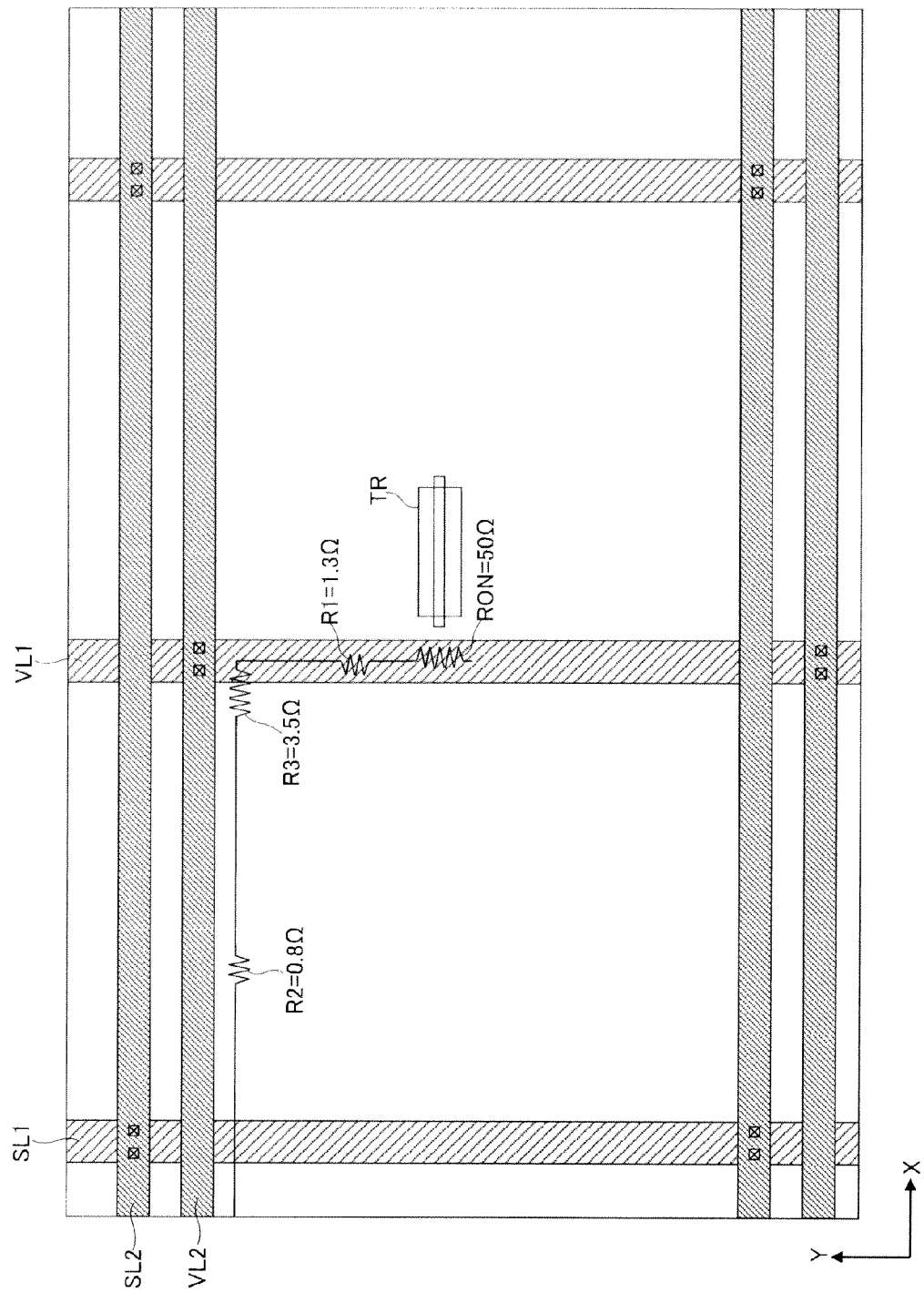
FIG. 9 is a schematic plane view illustrating a specific example of the parasitic resistance components.

In the example shown in FIG. 9, the resistances R1, R2, and R3 are 1.3Ω, 0.8Ω, and 3.5Ω, respectively. Accordingly, the parasitic resistance components that are superimposed on the on-resistance RON amount to 5.6Ω. The on-resistance RON of the transistor TR varies according to the channel width. For example, if RON=50Ω, the parasitic resistance components (5.6Ω) exceeds 10 percent of the on-resistance RON, having an unignorable impact on transistor characteristics. In such a case, in order to reduce the parasitic resistance components, it is necessary to further widen the width of the power-supply main lines, or to increase the number of power-supply main lines, thereby increasing the total area of the intersection regions and placing a larger number of conductor plugs. However, such a method entails an increase in the area of the chip as the width of the power-supply main lines increases, or as the number of power-supply main lines increases.

The parasitic resistance components also include a resistance component of a wiring portion 12 that extends from the pad region 10 to the logic circuit formation region 20 as shown in FIG. 1. Moreover, in a transistor with a large channel width such as an output buffer, the on-resistance RON is small. Accordingly, the parasitic resistance components need to be made smaller.

The above has described the problems that the present inventors examined. According to embodiments of the present invention, a semiconductor device that is designed to solve the above problems, and a layout method thereof are provided. The following describes preferred embodiments of the present invention. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

A semiconductor device according to the first embodiment of the present invention will be explained with reference to FIG. 10. In the present embodiment, and in other embodiments described later, the components corresponding to those described in FIGS. 1 to 9 are represented by the same reference symbols, and duplicate descriptions will be omitted.

Figure 10:
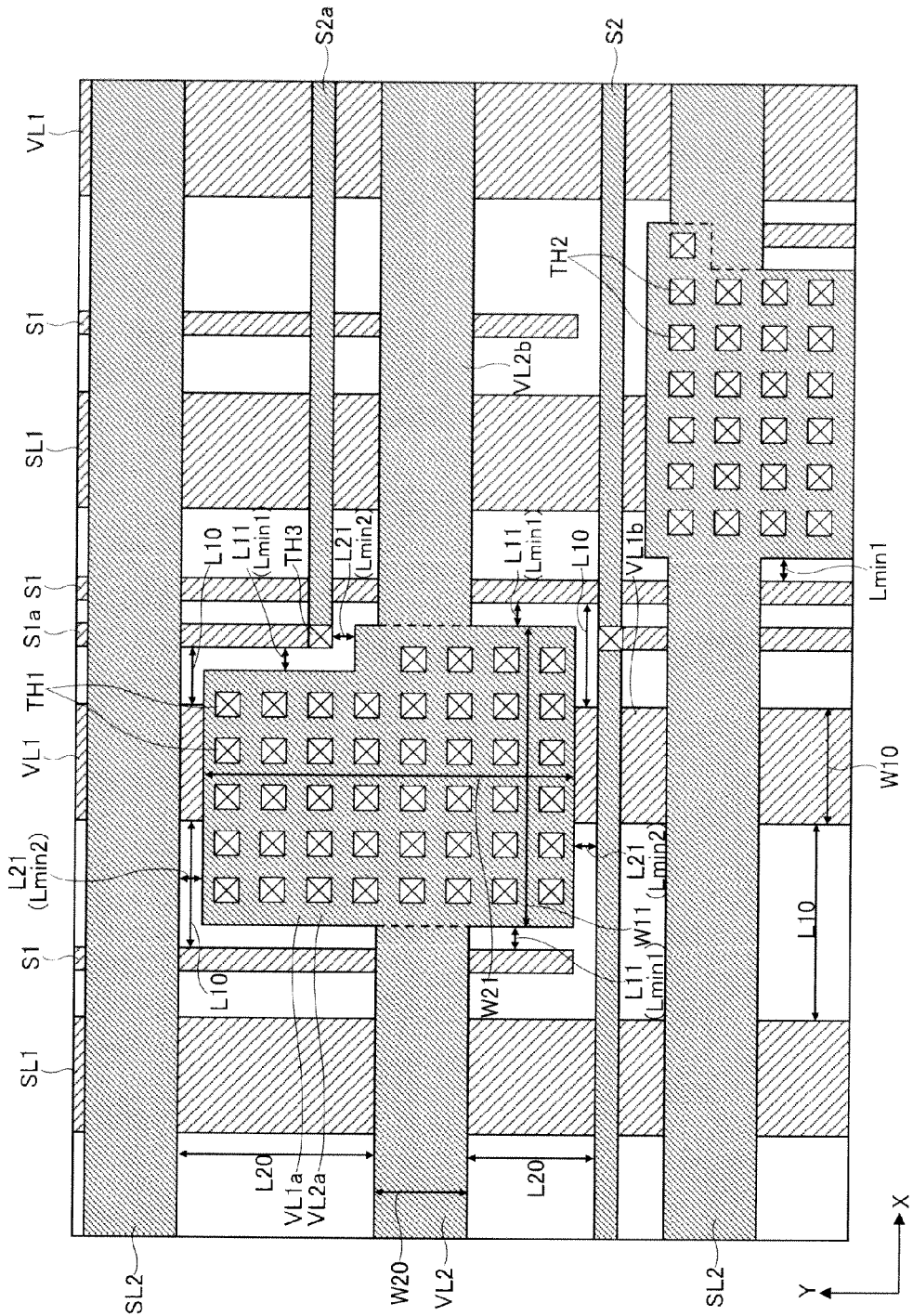
FIG. 10 is a schematic plane view showing major portions of a semiconductor device according to a first embodiment of the present invention.

As shown in FIG. 10, according to the present embodiment, the width of power-supply main lines is locally increased in intersection regions, allowing a larger number of conductor plugs to be disposed in the intersection regions. More specifically, a power-supply main line VL1 that extends in the Y-direction on a wiring layer L1 includes an intersection region VL1a, which overlaps with a power-supply main line VL2 in planar view; and a non-intersection region VL1b, which does not overlap with the power-supply main line VL2 in planar view. The X-direction width W11 of the intersection region VL1a is made larger than the X-direction width W10 of the non-intersection region VL1b. Similarly, a power-supply main line VL2 that extends in the X-direction on a wiring layer L2 includes an intersection region VL2a, which overlaps with a power-supply main line VL1 in planar view; and a non-intersection region VL2b, which does not overlap with the power-supply main line VL1 in planar view. The Y-direction width W21 of the intersection region VL2a is made larger than the X-direction width W20 of the non-intersection region VL2b. Power-supply main lines SL1 and SL2 have similar features.

In that manner, according to the present embodiment, the width of the power-supply mainlines is locally increased in the intersection regions. Therefore, compared with the case where the area of the intersection regions is not increased as in the example shown in FIG. 5, a larger number of conductor plugs TH1 and TH2 can be formed. As a result, the resistance R3 that is associated with the conductor plugs TH1 and TH2 is dramatically reduced, making it possible to reduce the parasitic resistance components superimposed on on-resistance RON and to obtain desired transistor characteristics.

In this case, the X-direction width W11 of the intersection region VL1a is increased to such an extent as not to interfere with a signal line S1 that is adjacent in the X-direction, or a power-supply main line SL1. In particular, it is preferred that a separation distance L11 between a side of the intersection region VL1a that extends in the Y-direction and the adjacent signal line S1 or power-supply main line SL1 be so designed as to be minimum processing size Lmin1. The minimum processing size Lmin1 is a minimum line width or minimum space width on the wiring layer L1, which is determined by exposure limit, and is equal to a minimum separation distance between a plurality of adjacent signal lines S1. Since the width of the intersection region VL1a is increased in the X-direction as described above, the X-direction separation distance L11 between the intersection region VL1a and the signal line S2 or power-supply main line SL1 becomes smaller than a separation distance L10 between the non-intersection region VL1b and the signal line S1 or power-supply main line SL1.

Similarly, the Y-direction width W21 of the intersection region VL2a is increased to such an extent as not to interfere with a signal line S2 that is adjacent in the Y-direction, or a power-supply main line SL2. In particular, it is preferred that a separation distance L21 between a side of the intersection region VL2a that extends in the X-direction and the adjacent signal line S2 or power-supply main line SL2 be so designed as to be minimum processing size Lmin2. The minimum processing size Lmin2 is a minimum line width or minimum space width on the wiring layer L2, which is determined by exposure limit, and is equal to a minimum separation distance between a plurality of adjacent signal lines S2. Since the width of the intersection region VL2a is increased in the Y-direction as described above, the Y-direction separation distance L21 between the intersection region VL2a and the signal line S2 or power-supply main line SL2 becomes smaller than a separation distance L20 between the non-intersection region VL2b and the signal line S2 or power-supply main line SL2.

As described above, the area of the intersection regions VL1a and VL2a is maximized to such an extent as not to interfere with the signal lines S1 and S2 or power-supply main lines SL1 and SL2. Therefore, a larger number of conductor plugs TH1 can be formed. The same is true for the intersection regions SL1a and SL2a: a larger number of conductor plugs TH2 can be formed.

Incidentally, in the example shown in FIG. 10, predetermined signal lines S1a and S2a are terminated in a formation region of a conductor plug TH3. As a result, the signal line S1 that is adjacent in the X-direction to the intersection region VL1a varies according to the Y-coordinate. The signal line S2 that is adjacent in the Y-direction to the intersection region VL2a varies according to the X-coordinate. In such a case, as shown in FIG. 10, along an adjacent wiring pattern, the shape of the intersection regions VL1a and VL2a may be turned into a staircase pattern. That is, the shape of the intersection regions VL1a and VL2a is not necessarily quadrilateral.

The following describes layout method of semiconductor device according to the present embodiment.

Figure 11:
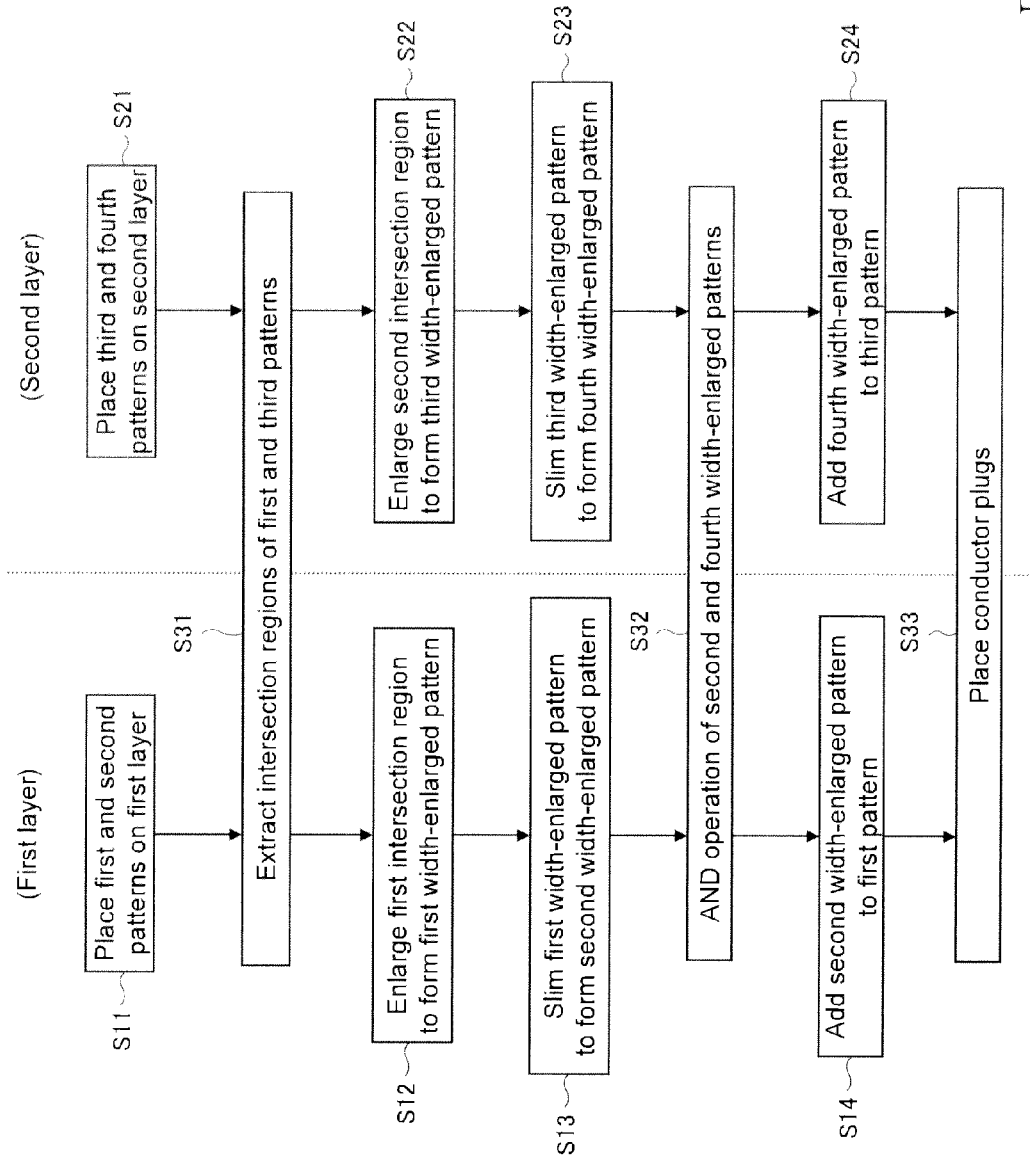
FIG. 11 is a flowchart illustrating a layout method of a semiconductor device according to the first embodiment of the present invention.

As shown in FIG. 11, the layout method of the semiconductor device of the present embodiment includes a process for a first layer, and a process for a second layer. The first layer corresponds to the wiring layer L1, and the second layer to the wiring layer L2.

Figure 12:
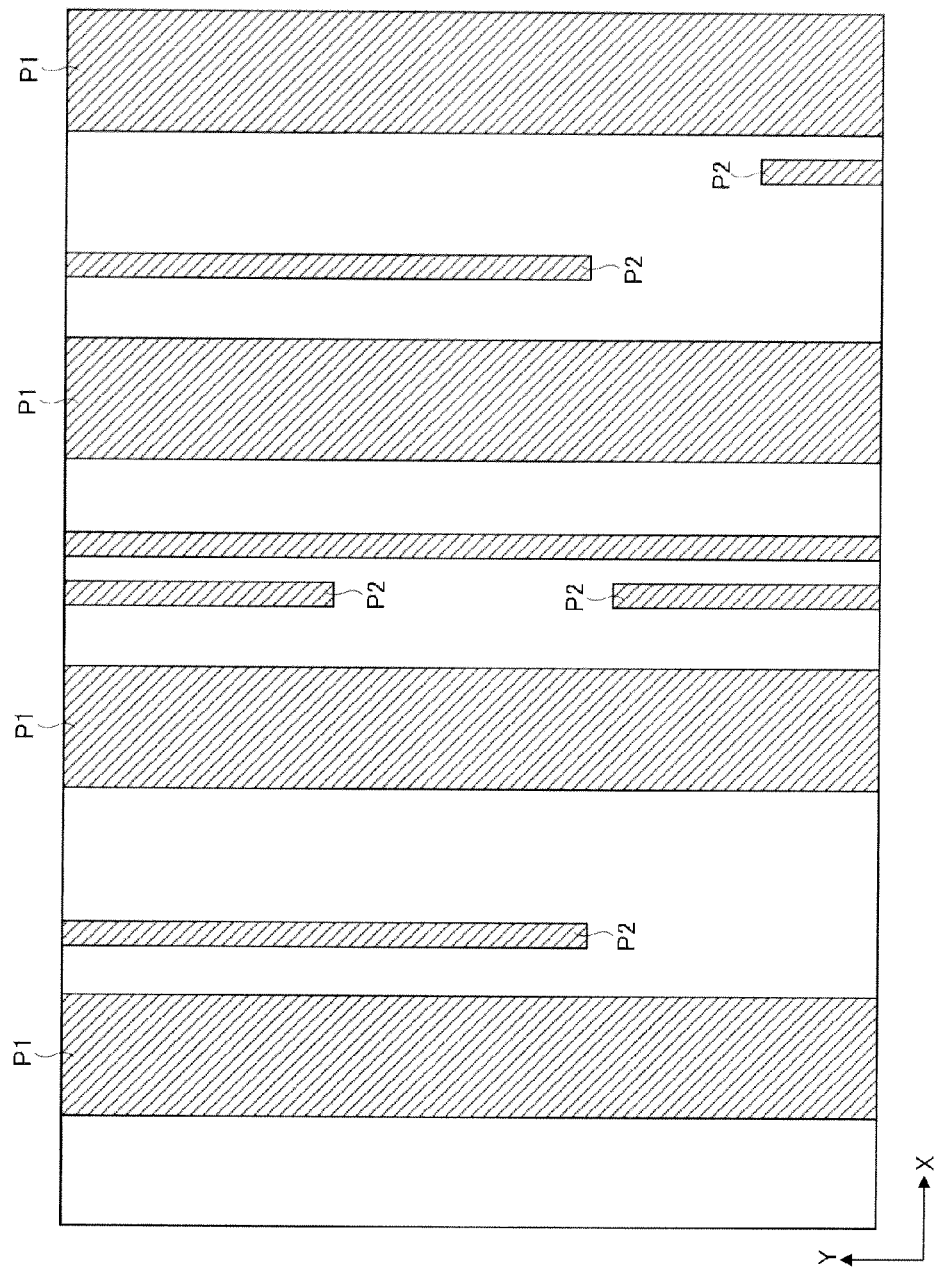
FIG. 12 shows the state of the first layer after step S11 is carried out.
Figure 13:
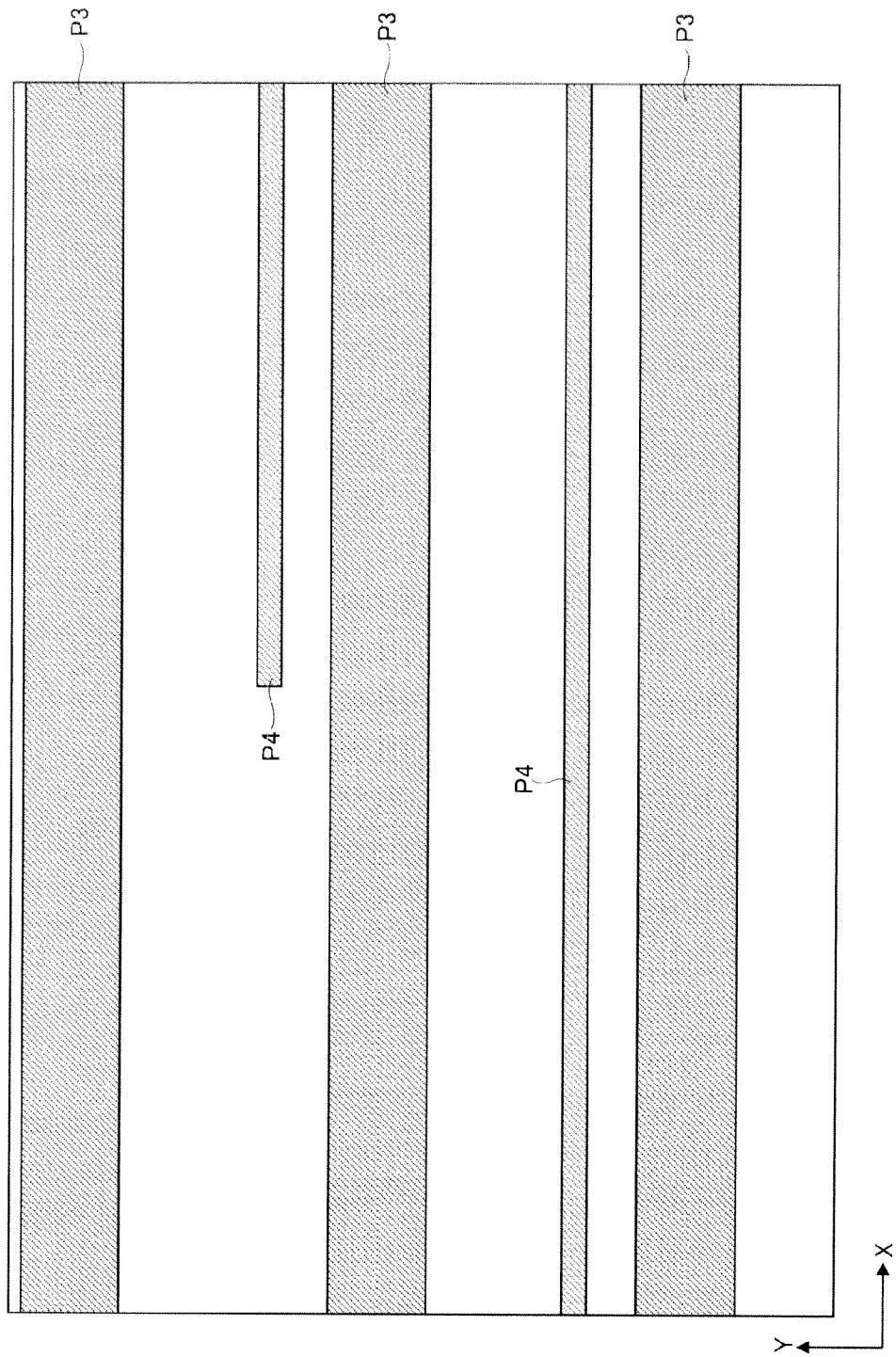
FIG. 13 shows the state of the second layer after step S21 is carried out.

First, on the first layer, a plurality of first and second patterns, which extend in the Y-direction, are disposed (Step S11). The first patterns are patterns corresponding to the power-supply main lines VL1 and SL1. The second patterns are patterns corresponding to the signal lines S1. FIG. 12 shows the state of the first layer after step S11 is carried out. Reference symbols P1 and P2 represent the first and second patterns, respectively. Similarly, on the second layer, a plurality of third and fourth patterns, which extend in the X-direction, are disposed (Step S21). The third patterns are patterns corresponding to the power-supply main lines VL2 and SL2. The fourth patterns are patterns corresponding to the signal lines S2. FIG. 13 shows the state of the second layer after step S21 is carried out. Reference symbols P3 and P4 represent the third and fourth patterns, respectively. Incidentally, the phrase "patterns are disposed" means that wiring patterns are virtually laid out by electronic data in a layout device that is a computer, and does not mean that physical wirings are placed on an actual device.

Figure 14:
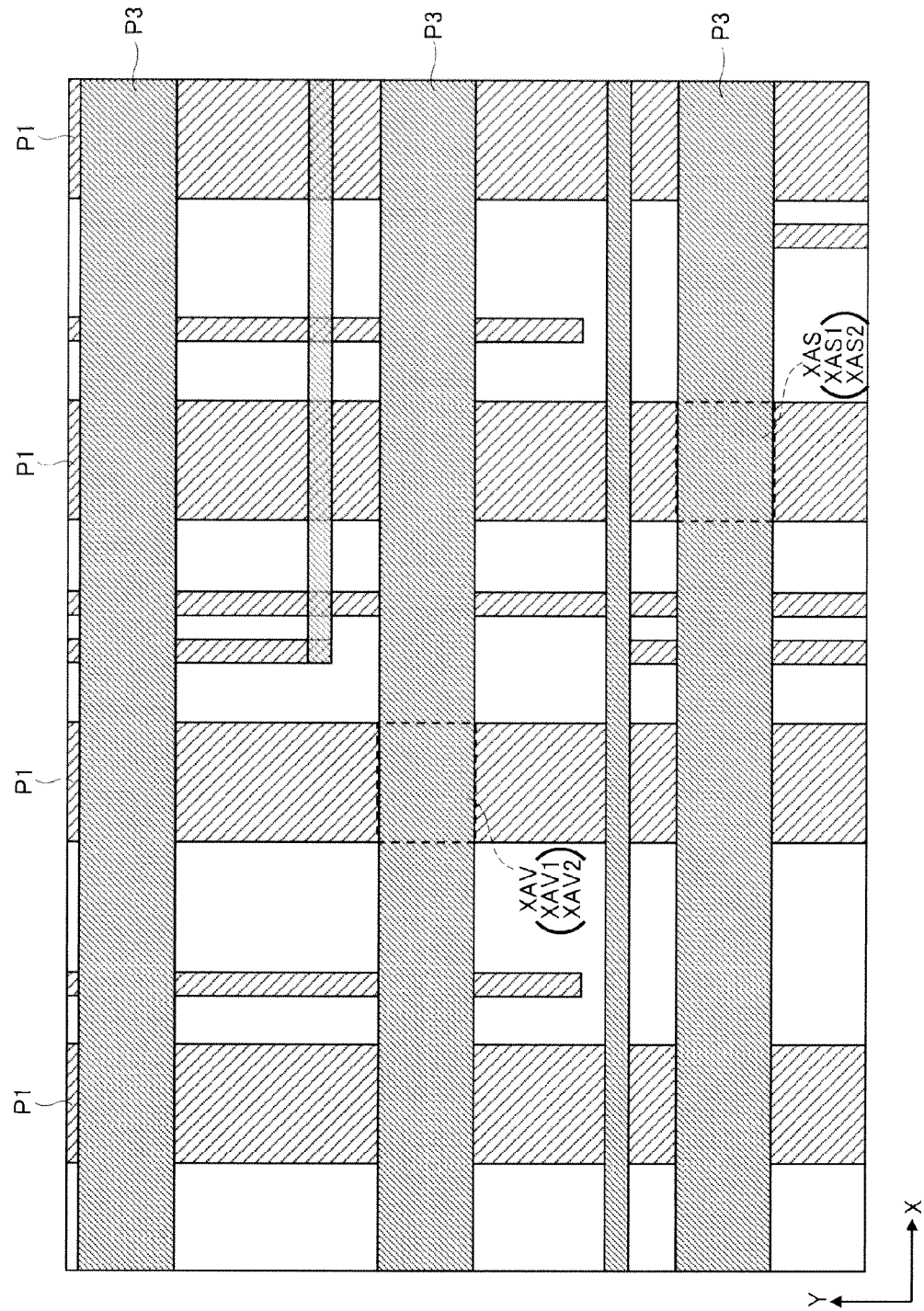
FIG. 14 shows the state of the first and second layers after step S31 is carried out.

Then, by putting the first layer on the second layer, intersection regions XA where the first patterns P1 and the third patterns P3 overlap with each other in planar view are extracted (Step S31). As shown in FIG. 14, the intersection regions XA include an intersection region XAV, where the first pattern P1 that corresponds to the power-supply main line VL1, and the third pattern P3 that corresponds to the power-supply main line VL2 cross each other; and an intersection region XAS, where the first pattern P1 that corresponds to the power-supply main line SL1, and the third pattern P3 that corresponds to the power-supply main line SL2 cross each other. The intersection regions XAV include a first intersection region XAV1 that belongs to the first pattern P1, and a second intersection region XAV2 that belongs to the third pattern P3. The intersection regions XAS include a first intersection region XAS1 that belongs to the first pattern P1, and a second intersection region XAS2 that belongs to the third pattern P3.

Figure 15:
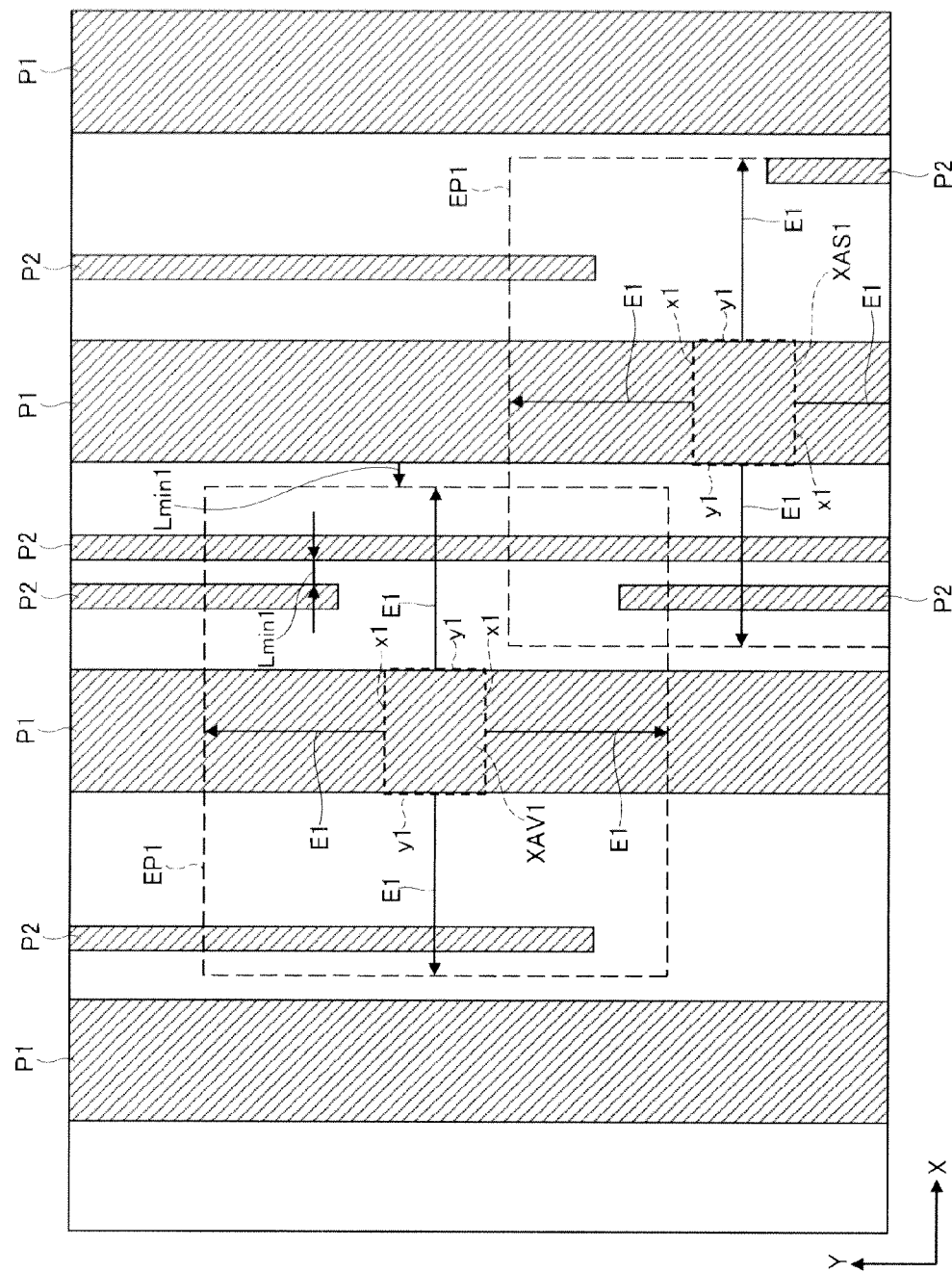
FIG. 15 shows the state of the first layer after step S12 is carried out.

Then, as shown in FIG. 15, among the sides that constitute the first intersection regions XAV1 and XAS1, the side y1, which extends in the Y-direction, is enlarged by a distance equivalent to length E1 in the X-direction (Step S12). The enlarged side y1 is positioned in such a way as to recede by a distance equivalent to the minimum processing size Lmin1 from one side of another first pattern P1 that is closest to the above first pattern P1. Furthermore, among the sides that constitute the first intersection regions XAV1 and XAS1, the side x1, which extends in the X-direction, is enlarged by the same distance, or the distance equivalent to length E1, in the Y-direction. In this manner, the first intersection regions XAV1 and XAS1 are turned into first width-enlarged patterns EP1.

Figure 16:
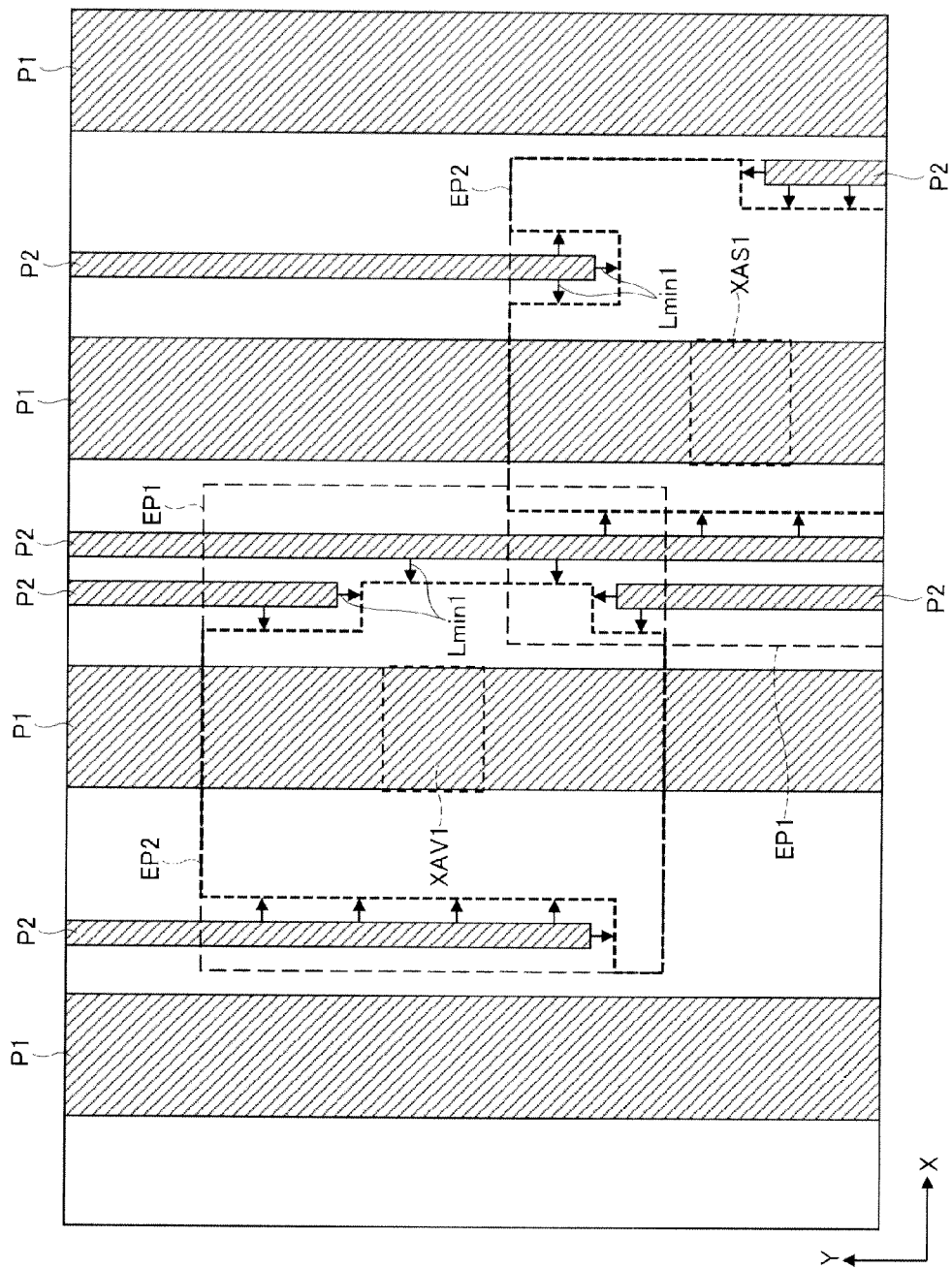
FIG. 16 shows the state of the first layer after step S13 is carried out.

Then, as shown in FIG. 16, the portions that interfere with the second patterns P2 or another width-enlarged pattern EP1 are removed from the first width-enlarged pattern EP1. In this manner, the first width-enlarged pattern EP1 is turned into a second width-enlarged pattern EP2 (Step S13). During the present process, not only are the portions that directly interfere with the second patterns P2 or another width-enlarged pattern EP1 removed, but the portions that interfere with regions made by enlarging the above patterns by the distance equivalent to the minimum processing size Lmin1 are also removed from the first width enlarged pattern EP1. The reason is that, in the regions that do not directly interfere with the second patterns P2 or another width-enlarged pattern EP1 but are within a distance of minimum processing size Lmin1 from the above patterns, no wiring pattern can be formed. Therefore, it is necessary to remove the portions of the first width-enlarged pattern EP1 that exist in such regions.

Figure 17:
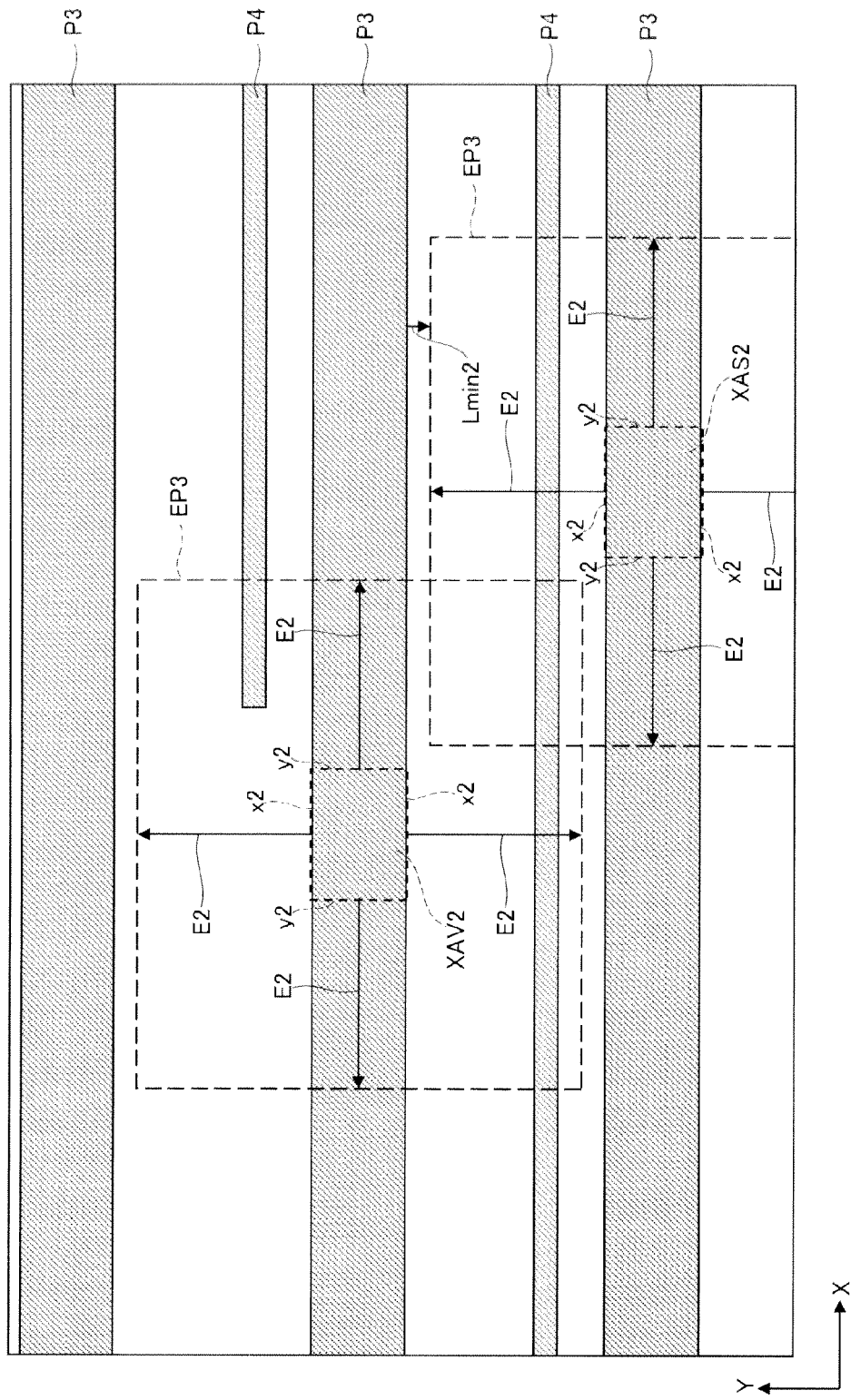
FIG. 17 shows the state of the second layer after step S22 is carried out.

The above process is similarly carried out for the second layer. That is, as shown in FIG. 17, among the sides that constitute the second intersection regions XAV2 and XAS2, the side x2, which extends in the X-direction, is enlarged by a distance equivalent to length E2 in the Y-direction (Step S22). The enlarged side x2 is positioned in such a way as to recede by a distance equivalent to the minimum processing size Lmin2 from one side of another third pattern P3 that is closest to the above third pattern P3. Furthermore, among the sides that constitute the second intersection regions XAV2 and XAS2, the side y2, which extends in the Y-direction, is enlarged by the same distance, or the distance equivalent to length E2, in the X-direction. In this manner, the second intersection regions XAV2 and XAS2 are turned into third width-enlarged patterns EP3.

Figure 18:
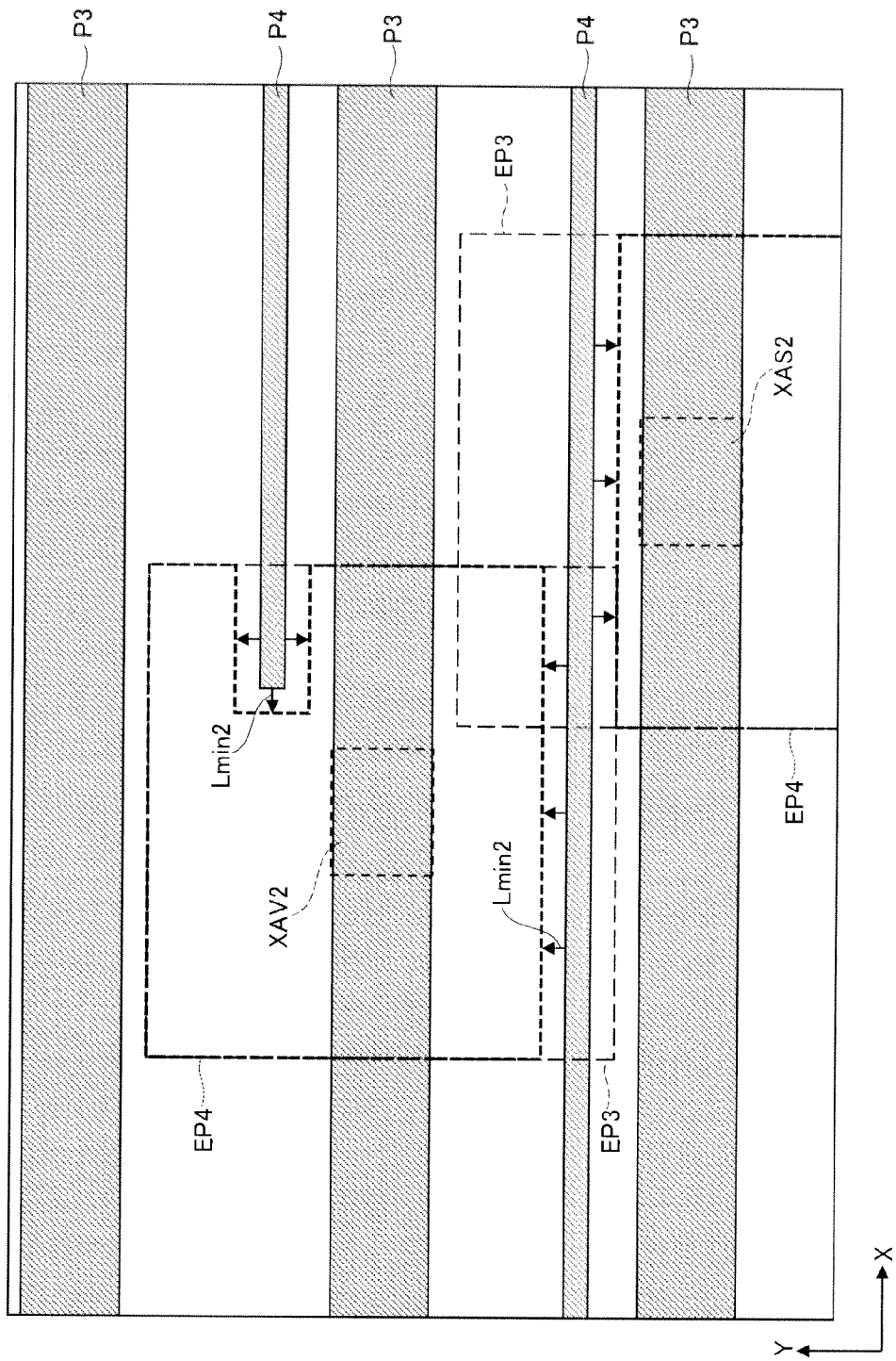
FIG. 18 shows the state of the second layer after step S23 is carried out.

Then, as shown in FIG. 18, the portions that interfere with the fourth patterns P4 or another width-enlarged pattern EP3 are removed from the third width-enlarged pattern EP3. In this manner, the third width-enlarged pattern EP3 is turned into a fourth width-enlarged pattern EP4 (Step S23). During the present process, not only are the portions that directly interfere with the fourth patterns P4 or another width-enlarged pattern EP3 removed, but the portions that interfere with regions made by enlarging the above patterns by the distance equivalent to the minimum processing size Lmin2 are also removed from the third width-enlarged pattern EP3 for the same reason. As shown in FIG. 18, a concave portion may be formed on one side of the fourth width-enlarged pattern EP4.

Figure 19:
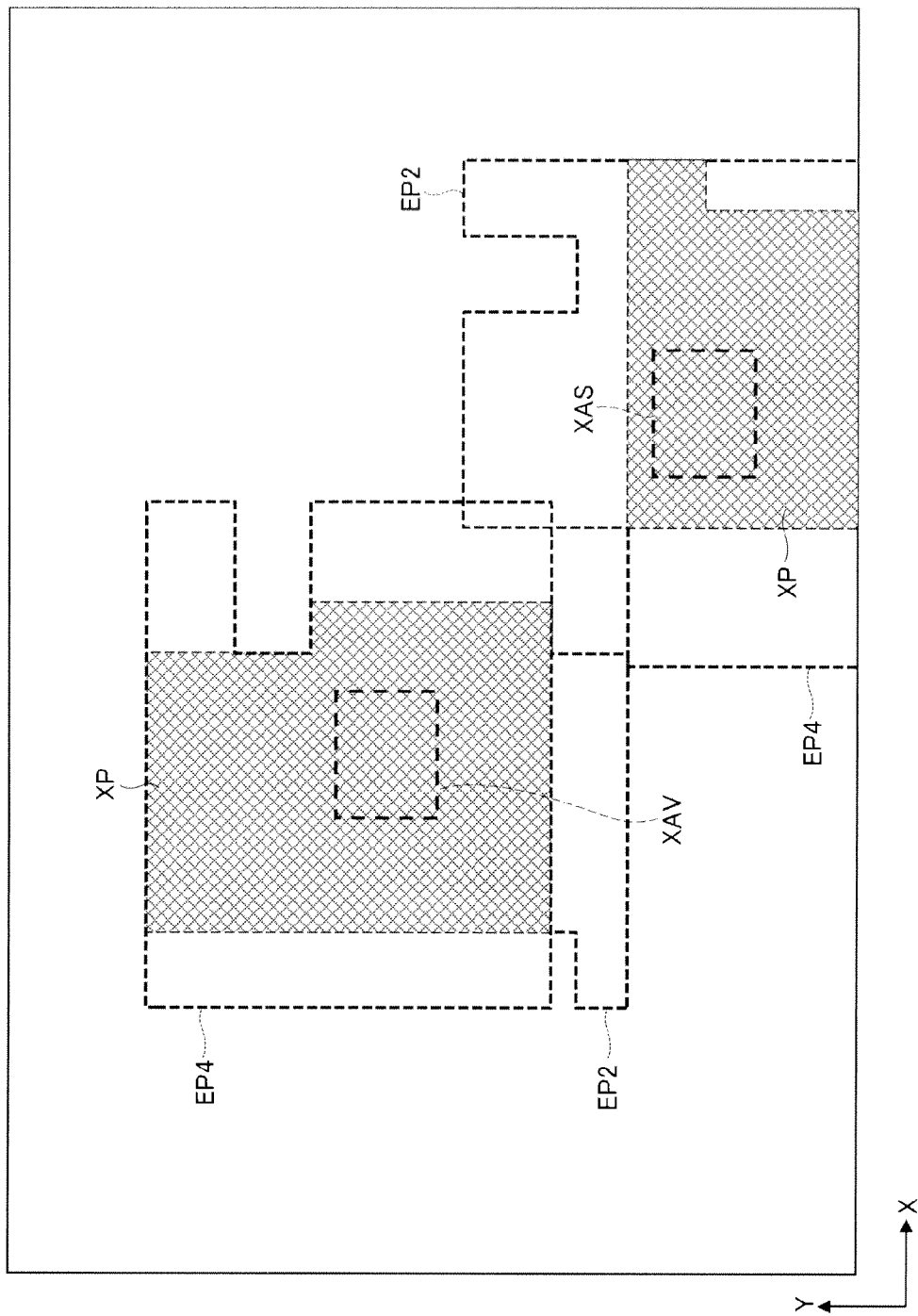
FIG. 19 shows the state of the first and second layers after step S32 is carried out.
Figure 20:
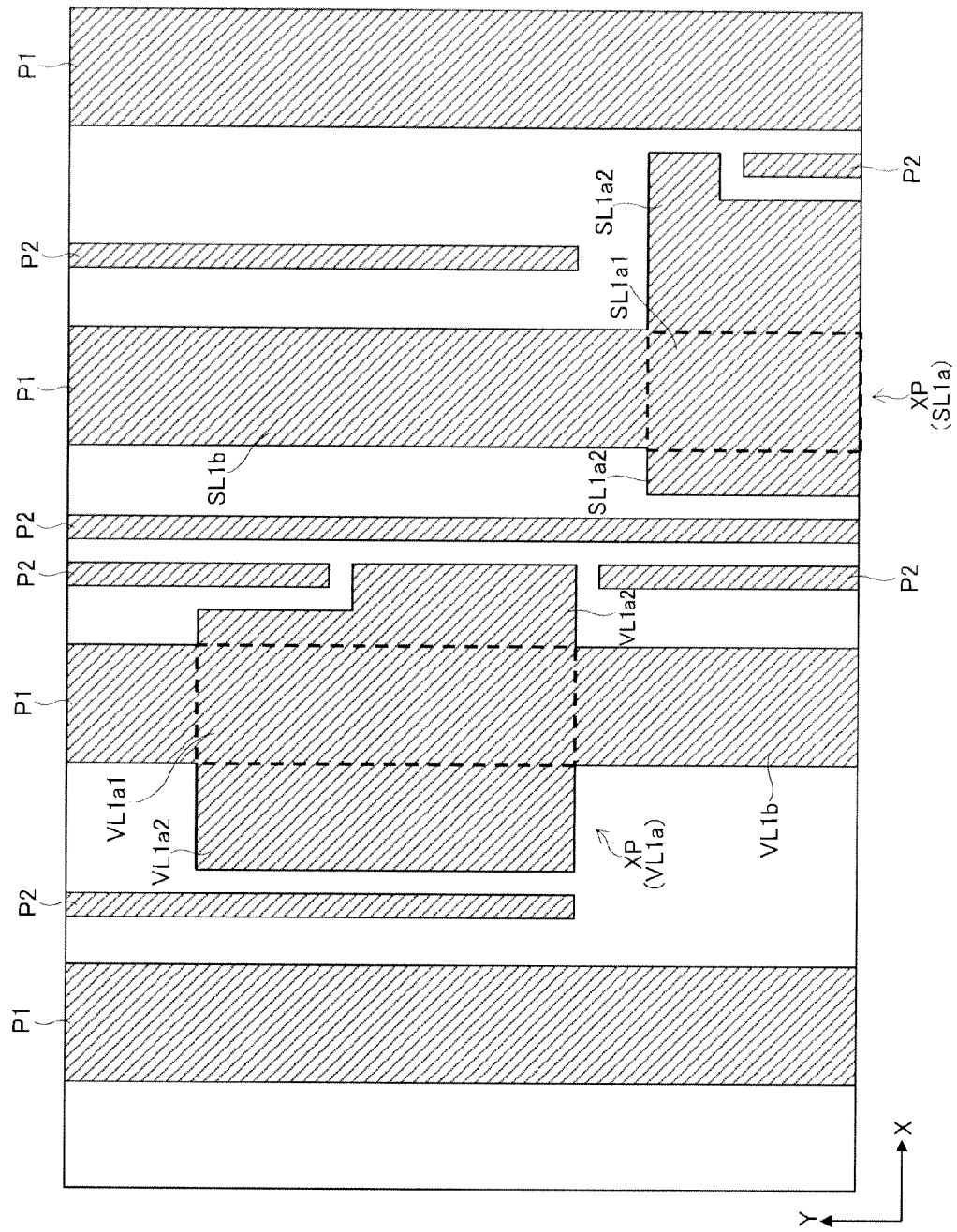
FIG. 20 shows the state of the first layer after step S14 is carried out.
Figure 21:
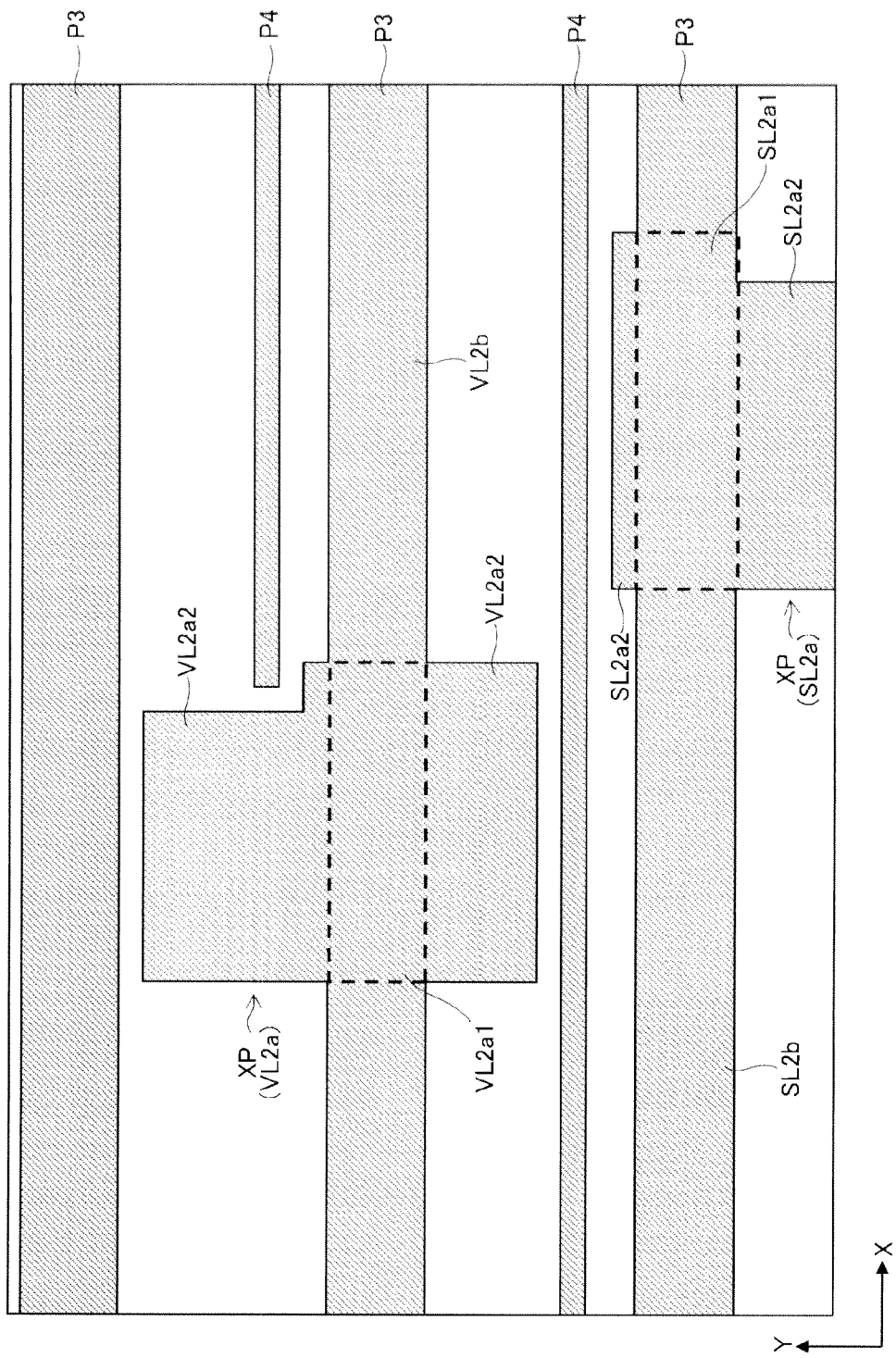
FIG. 21 shows the state of the second layer after step S24 is carried out.

Then, as shown in FIG. 19, the first layer is put on the second layer, and intersection regions XP where the second width-enlarged patterns EP2 and the fourth width-enlarged patterns EP4 overlap with each other in planar view are defined (Step S32). Portions of the second width-enlarged patterns EP2 that correspond to the intersection regions XP are added to the first patterns P1 (Step S14). FIG. 20 shows the state of the first layer after step S14 is carried out. The intersection regions XP shown in FIG. 20 correspond to the first intersection regions VL1a and SL1a shown in FIG. 10. Similarly, portions of the fourth width-enlarged patterns EP4 that correspond to the intersection regions XP are added to the third patterns P3 (Step S24). FIG. 21 shows the state of the second layer after step S24 is carried out. The intersection regions XP shown in FIG. 21 correspond to the second intersection regions VL2a and SL2a shown in FIG. 10.

Then, the following conductor plugs are disposed (Step S33): the conductor plugs TH1, which connect the first intersection region VL1a and the second intersection region VL2a; the conductor plugs TH2, which connect the first intersection region SL1a and the second intersection region SL2a; and the conductor plugs TH3, which connect the signal lines S1 and the signal lines S2. As a result, the layout of the semiconductor device shown in FIG. 10 is completed.

In this case, as for the intersection regions VL1a (XP) shown in FIG. 20, the region positioned on a line that is extended in the Y-direction from the non-intersection region VL1b is a main region VL1a1; the regions positioned in different portions from the line that is extended in the Y-direction from the non-intersection region VL1b are width-enlarged regions VL1a2. The main region VL1a1 is a region that already exists at step S11. The width-enlarged regions VL1a2 are regions that are added at step S14. Similarly, as for the intersection regions VL2a shown in FIG. 21, the region positioned on a line that is extended in the X-direction from the non-intersection region VL2b is a main region VL2a1; the regions positioned in different portions from the line that is extended in the X-direction from the non-intersection region VL2b are width-enlarged regions VL2a2. The main region VL2a1 is a region that already exists at step S21. The width-enlarged regions VL2a2 are regions that are added at step S24.

A plurality of conductor plugs TH1 shown in FIG. 10 include a first conductor plug, which connects the main region VL1a1 and the main region VL2a1; a second conductor plug, which connects the width-enlarged region VL1a2 and the width-enlarged region VL2a2; a third conductor plug, which connects the main region VL1a1 and the width-enlarged region VL2a2; and a fourth conductor plug, which connects the width-enlarged region VL1a2 and the main region VL2a1.

Among the first to fourth conductor plugs, the second to fourth conductor plugs are conductor plugs that can be added according to the present embodiment. The addition of the conductor plugs helps to reduce the resistance R3 of the conductor plugs TH1. The same is true for the conductor plugs TH2, which connect the intersection region SL1a and the intersection region SL2a. The addition of the second to fourth conductor plugs makes it possible to reduce the resistance R3.

As described above, according to the present embodiment, in each intersection region, a larger number of conductor plugs TH1 and TH2 can be disposed. Therefore, the resistance R3 associated with the conductor plugs TH1 and TH2 can be reduced. As a result, the parasitic resistance components that are superimposed on the on-resistance RON of the transistor TR are reduced. Thus, it is possible to obtain desired transistor characteristics. Moreover, in the process of forming the intersection regions XP, the area of the intersection regions is maximized while the interference of the intersection regions with other wirings is prevented. Therefore, a larger number of conductor plugs TH1 and TH2 can be disposed.

According to the present embodiment, at step S12, the first width-enlarged pattern EP1 is enlarged to a position that has been moved a distance of minimum processing size Lmin1 backward from one side of another first pattern P1 that is closest to the above first pattern P1. Therefore, even if the formation pitch of the first pattern P1 is not constant, the area of the intersection regions can be maximized.

The following describes the second embodiment of the present invention.

Figure 22:
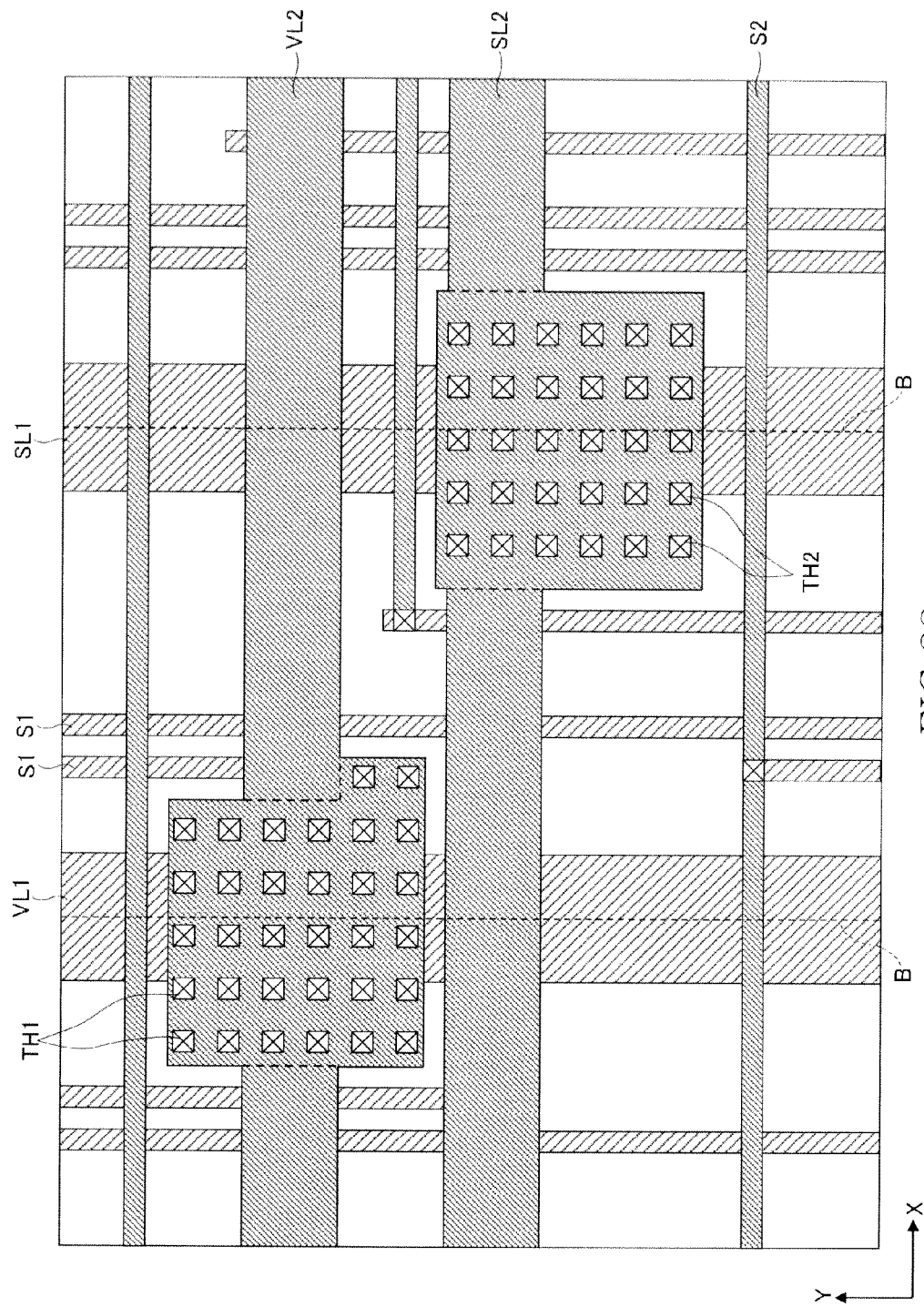
FIG. 22 is a schematic plane view showing major portions of a semiconductor device according to a second embodiment of the present invention.

As shown in FIG. 22, according to the present embodiment, the power-supply main lines VL1 and SL1 are disposed along boundaries B of the standard cells SC. The configurations of other components are basically the same as those of the first embodiment. Therefore, the same components are represented by the same reference symbols, and duplicate descriptions will be omitted.

The layout method of the semiconductor device of the present embodiment is similar to the layout method of the semiconductor device of the first embodiment. The following description focuses on different aspects of the layout method from the layout method of the semiconductor device of the first embodiment.

Figure 23:
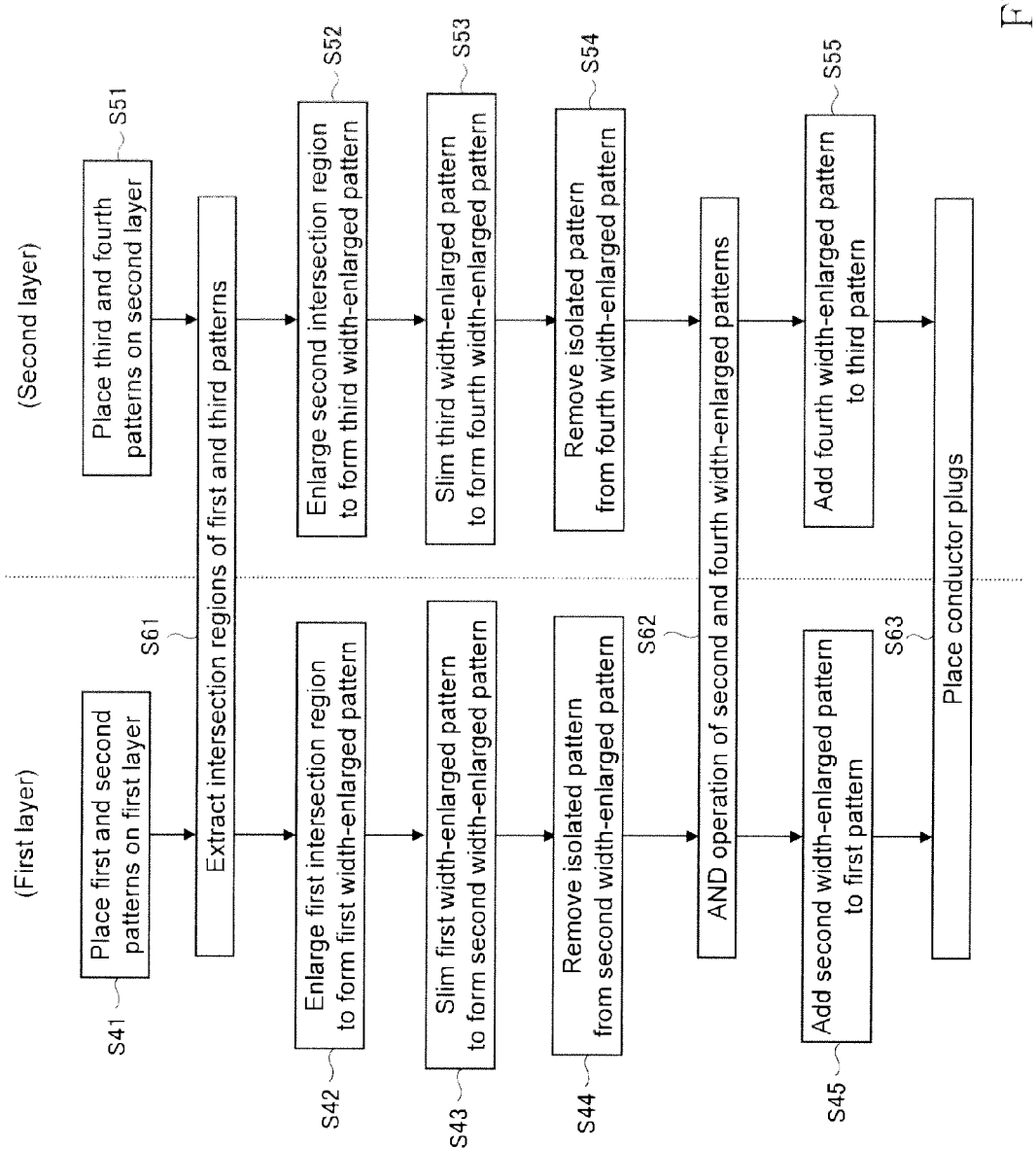
FIG. 23 is a flowchart illustrating a layout method of a semiconductor device according to the second embodiment of the present invention.
Figure 24:
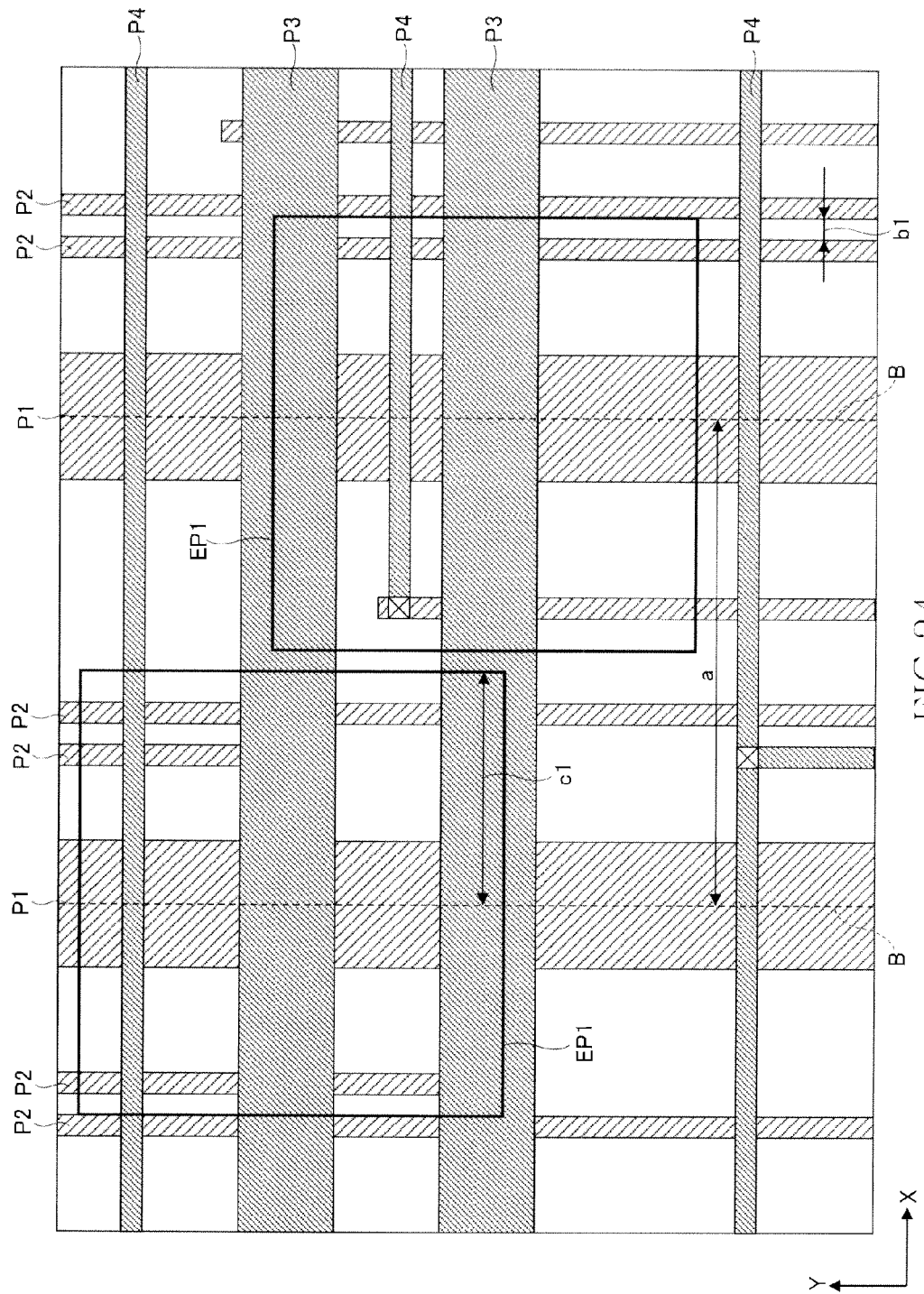
FIG. 24 shows the state of the first and second layers after step S42 is carried out.

As shown in FIG. 23, first, on the first layer, the first and second patterns P1 and P2 are disposed (Step S41). On the second layer, the third and fourth patterns P3 and P4 are disposed (Step S51). As shown in FIG. 24, at step S41, the first patterns P1 are disposed along the boundaries B of the standard cells SC. Then, by putting the first layer, on the second layer, intersection regions XA where the first patterns P1 and the third patterns P3 overlap with each other in planar view are extracted (Step 61).

Then, as shown in FIG. 24, the first intersection regions XAV1 and XAS1 are enlarged in the X- and Y-directions by a distance equivalent to length c1 from the center, thereby forming first width-enlarged patterns EP1 (Step S42). In this case, if the X-direction length of the standard cells SC is represented by a, and a minimum gap on the first layer by b1, then the following setting is adopted:

$$c1=(a+b1)/2$$

Figure 25:
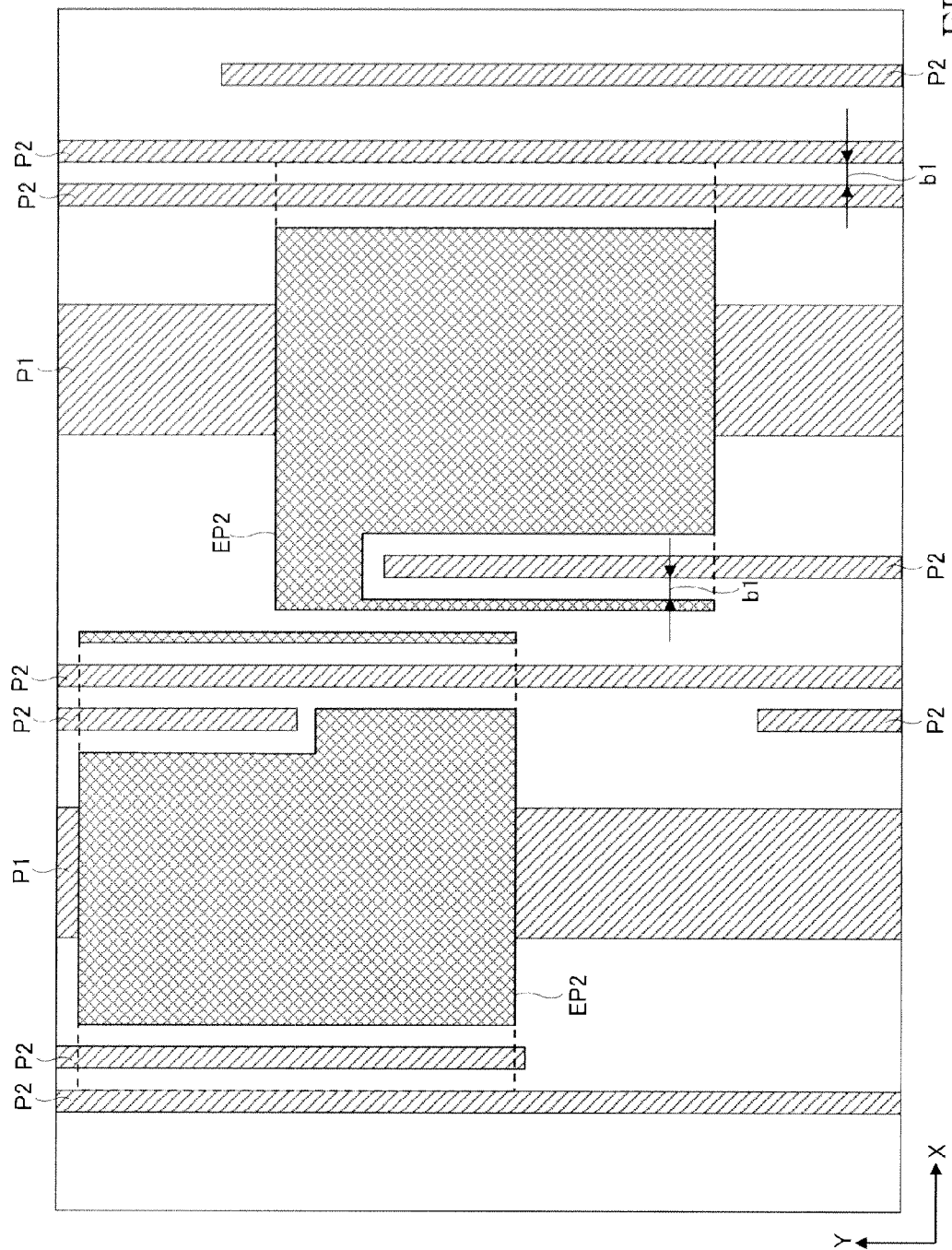
FIG. 25 shows the state of the first layer after step S43 is carried out.

As a result, the two width-enlarged patterns EP1 that are adjacent to each other in the X-direction do not interfere, and the gap therebetween becomes equal to the minimum gap b1 on the first layer. Then, as shown in FIG. 25, the portions that interfere with the second patterns P2 are removed from the first width-enlarged pattern EP1. In this manner, the first width-enlarged pattern EP1 is turned into a second width-enlarged pattern EP2 (Step S43). During the present process, as in the case of the first embodiment, not only are the portions that directly interfere with the second patterns P2 removed, but the portions that interfere with regions made by enlarging the second patterns P2 by the distance equivalent to the minimum gap b1 are also removed from the first width-enlarged pattern EP1.

Figure 26:
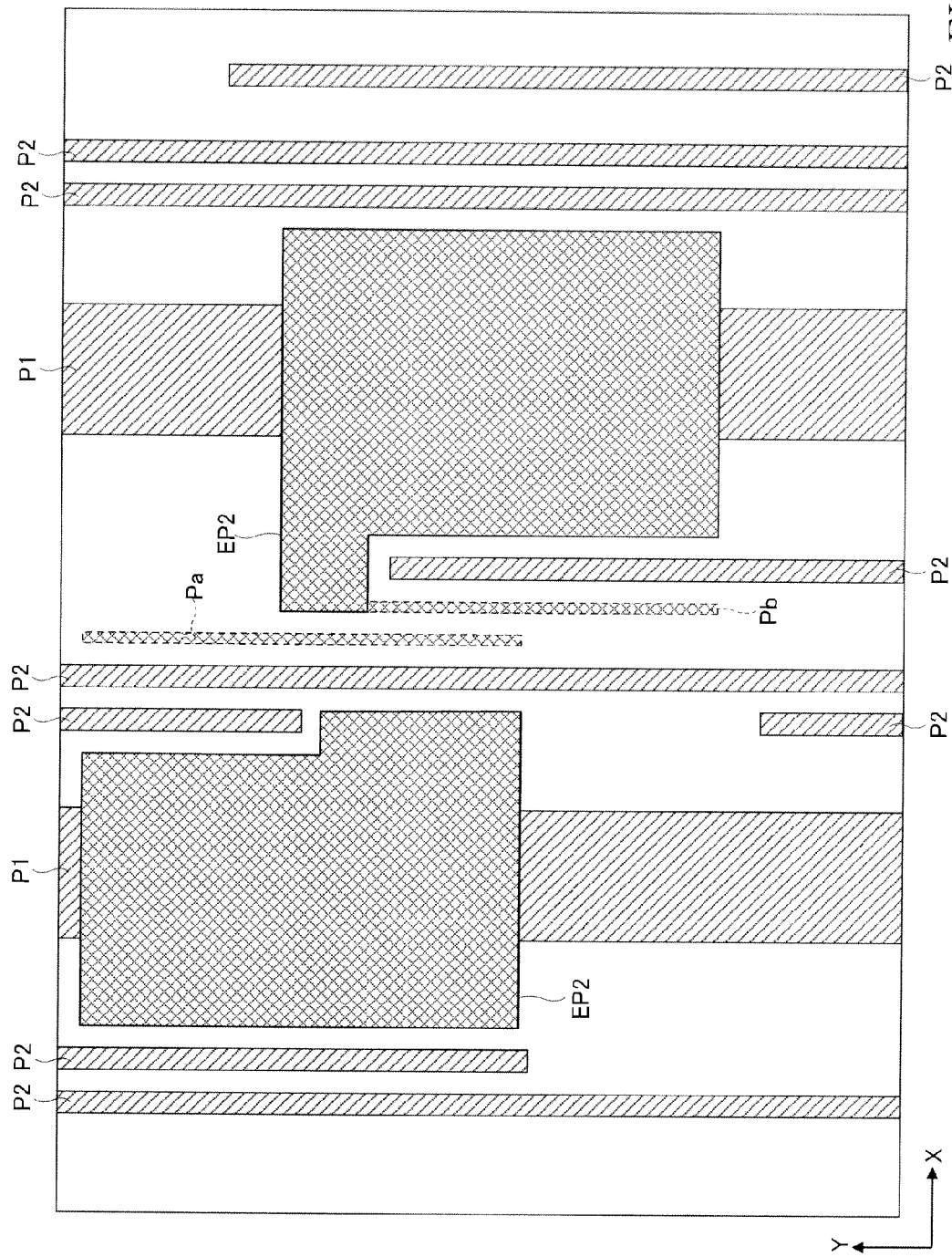
FIG. 26 shows the state of the first layer after step S43 is carried out.

As shown in FIG. 26, after step S43 is carried out, the following patterns may be formed: an isolated pattern Pa, which is separated from the first pattern P1; and an error pattern Pb, the line width of which is less than a minimum line width. According to the present embodiment, the patterns Pa and Pb are removed (Step S44).

The above process is similarly carried out for the second layer. That is, the second intersection regions XAV2 and XAS2 are enlarged in the X- and Y-directions by a distance equivalent to length c2 from the center, thereby forming third width-enlarged patterns EP3 (Step S52). In this case, if the X-direction length of the standard cells SC is represented by a, and a minimum gap on the second layer by b2, then the following setting is adopted:

$$c2=(a+b2)/2$$

Figure 27:
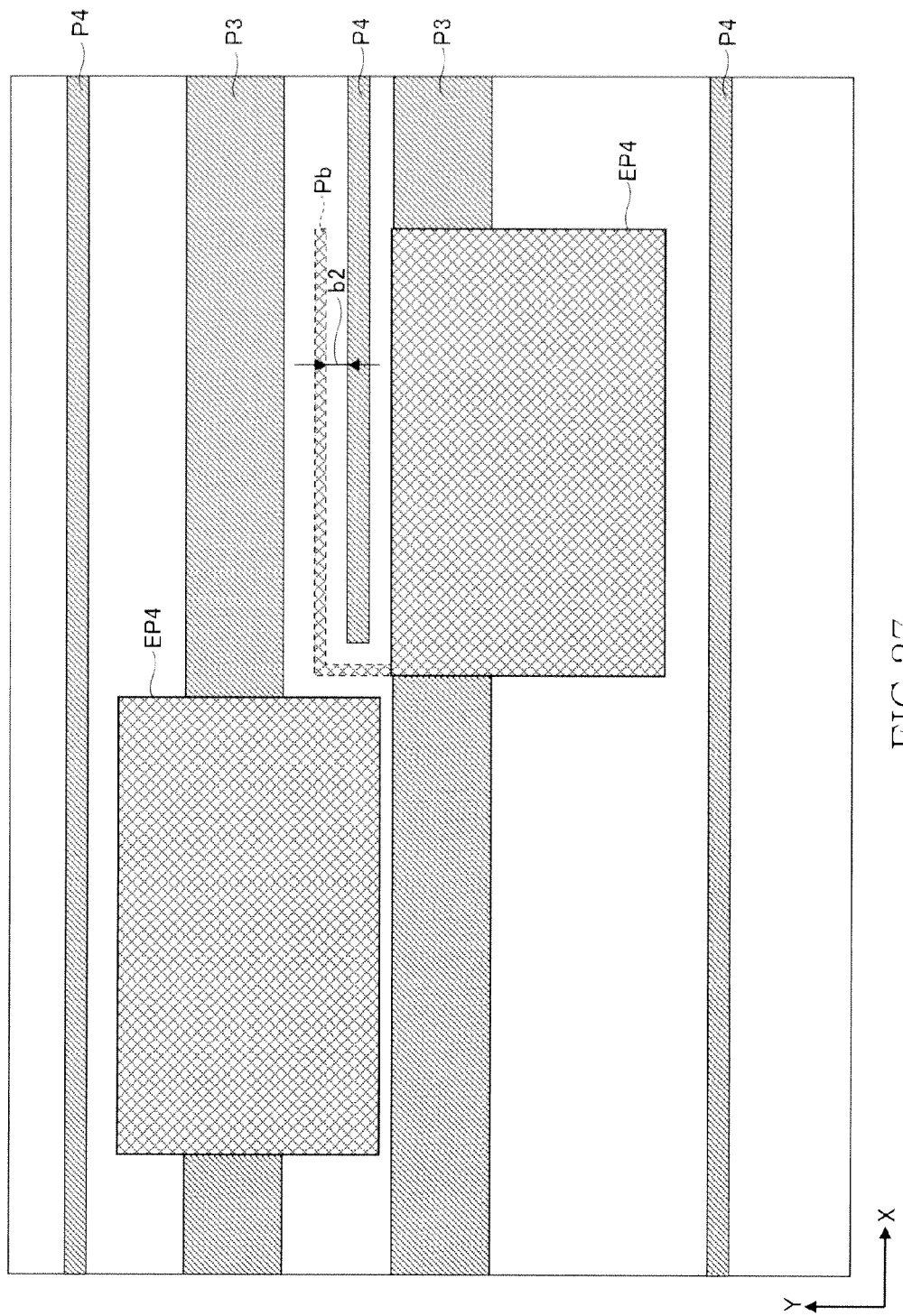
FIG. 27 shows the state of the second layer after step S53 is carried out.

Then, as shown in FIG. 27, the portions that interfere with the fourth patterns P4 are removed from the third width-enlarged pattern EP3. In this manner, the third width-enlarged pattern EP3 is turned into a fourth width-enlarged pattern EP4 (Step S53). On the second layer, if an isolated pattern Pa, which is separated from the third pattern P3, and an error pattern Pb, the line width of which is less than a minimum line width, are generated, the patterns Pa and Pb are removed (Step S54).

Figure 28:
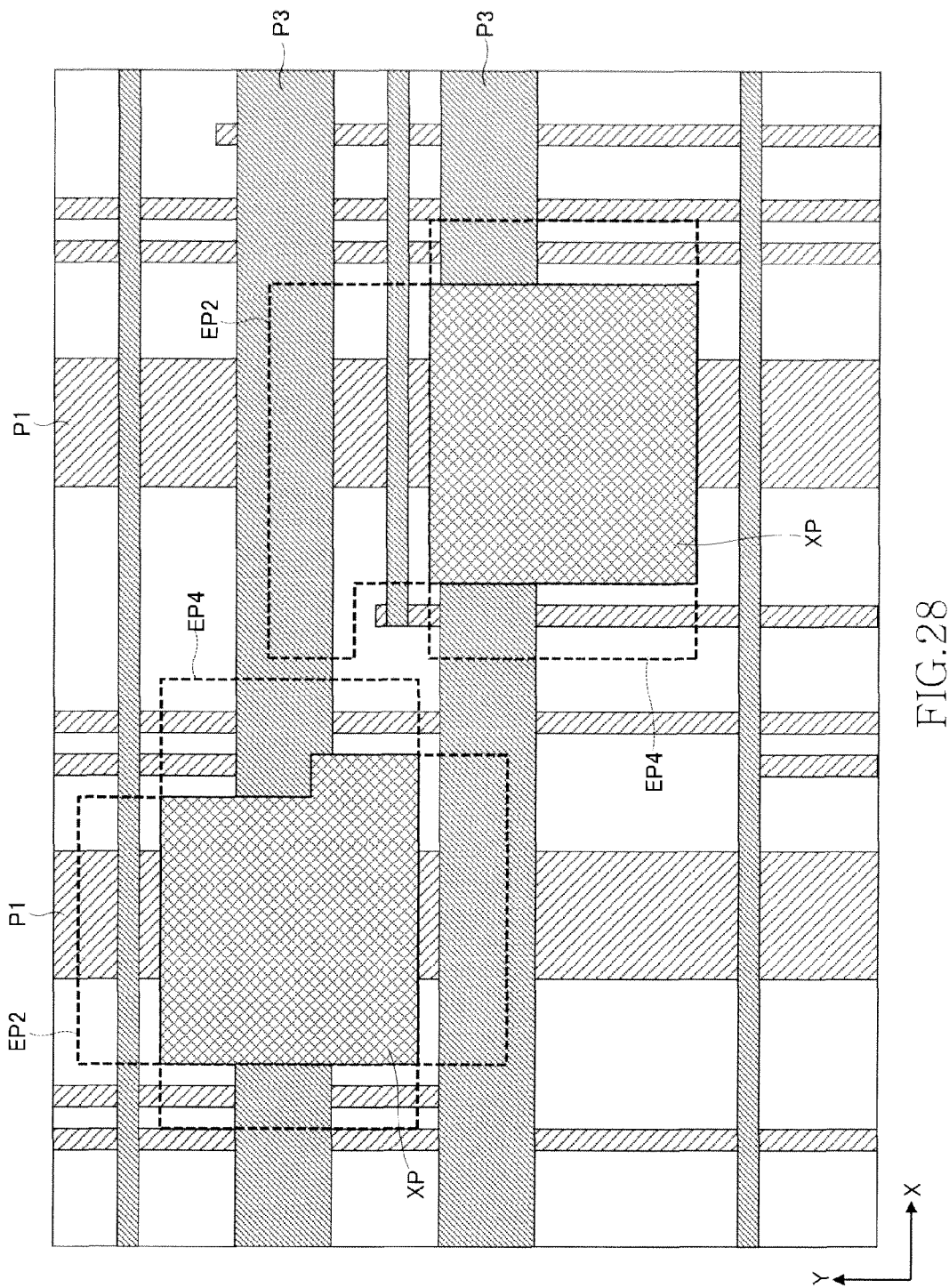
FIG. 28 shows the state of the first and second layers after step S62 is carried out.

Then, as shown in FIG. 28, the first layer is put on the second layer, and intersection regions XP where the second width-enlarged patterns EP2 and the fourth width-enlarged patterns EP4 overlap with each other in planar view are defined (Step S62). The subsequent processes are the same as those of the first embodiment. Portions of the second width-enlarged patterns EP2 that correspond to the intersection regions XP are added to the first patterns P1 (Step S45). Moreover, portions of the fourth width-enlarged patterns EP4 that correspond to the intersection regions XP are added to the third patterns P3 (Step S55). Then, at predetermined positions, conductor plugs TH1 to TH3 are disposed (Step S63). In this manner, the layout of the semiconductor device shown in FIG. 22 is completed.

As described above, the present embodiment can achieve the same advantageous effects as the first embodiment. Furthermore, according to the present embodiment, the sizes of the first width-enlarged patterns EP1 and the third width-enlarged patterns EP3 are uniquely defined, and the processes of steps S42 and S52 therefore can be dramatically simplified. The reason why such simplification is possible is that the pattern pitch of the first patterns P1 that are adjacent to each other in the X-direction is constant due to the adoption of the standard cell system.

The following describes the third embodiment of the present invention.

Figure 29:
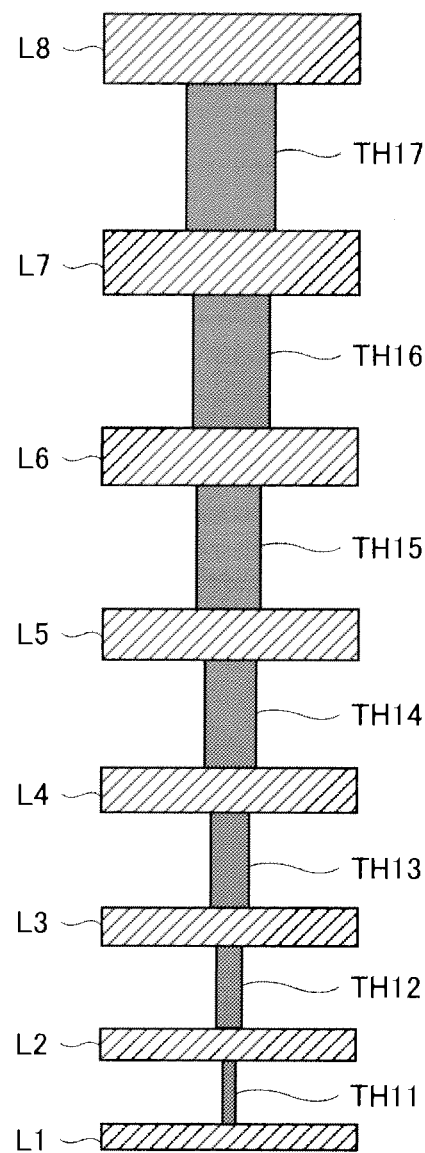
FIG. 29 shows eight wiring layers connected to one another via conductive plugs.

According to the above-described first and second embodiments, what is described is an example in which the two wiring layers L1 and L2 are used to form the power-supply main lines into a mesh pattern. However, three or more wiring layers may be used to form the power-supply main lines into a mesh pattern. For example, in a logic semiconductor device such as ASIC, as shown in FIG. 29, eight wiring layers L1 to L8 may be used. Two, three, or more of the wiring layers L1 to L8 may be used to form the power-supply main lines into a mesh pattern. The adjoining wiring layers are connected via conductor plugs TH11 to TH17. However, as shown in FIG. 29, the diameter of the conductor plugs tends to be larger toward the top layer. Therefore, the number of conductor plugs that can be disposed in one intersection region tends to be smaller toward the top layer. Even in this case, as described above in the first and second embodiments, the width of the power-supply main lines is locally increased in the intersection regions, allowing a larger number of conductor plugs to be disposed.

Figure 30:
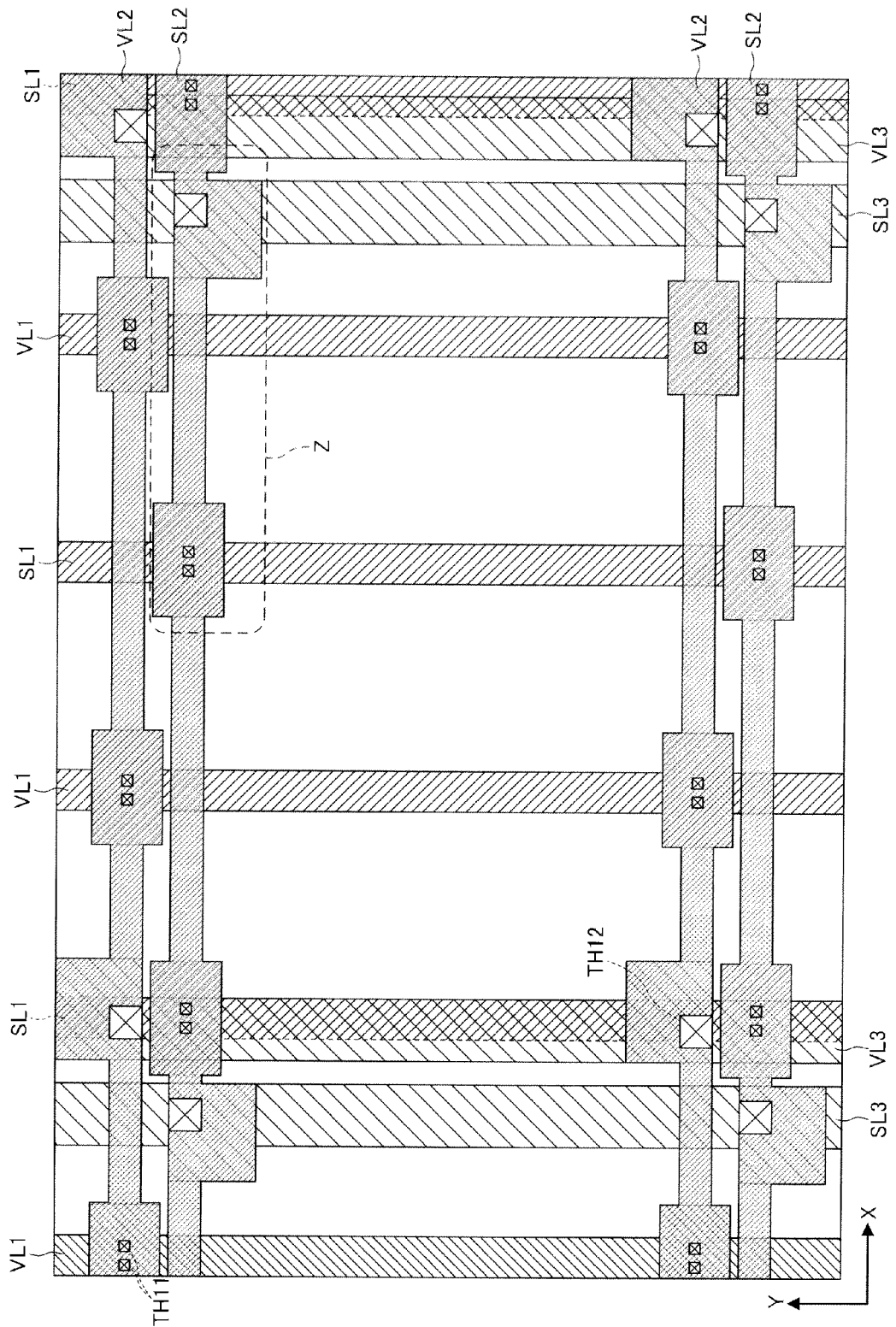
FIG. 30 is a schematic plane view showing major portions of a semiconductor device according to a third embodiment of the present invention.
Figure 31:
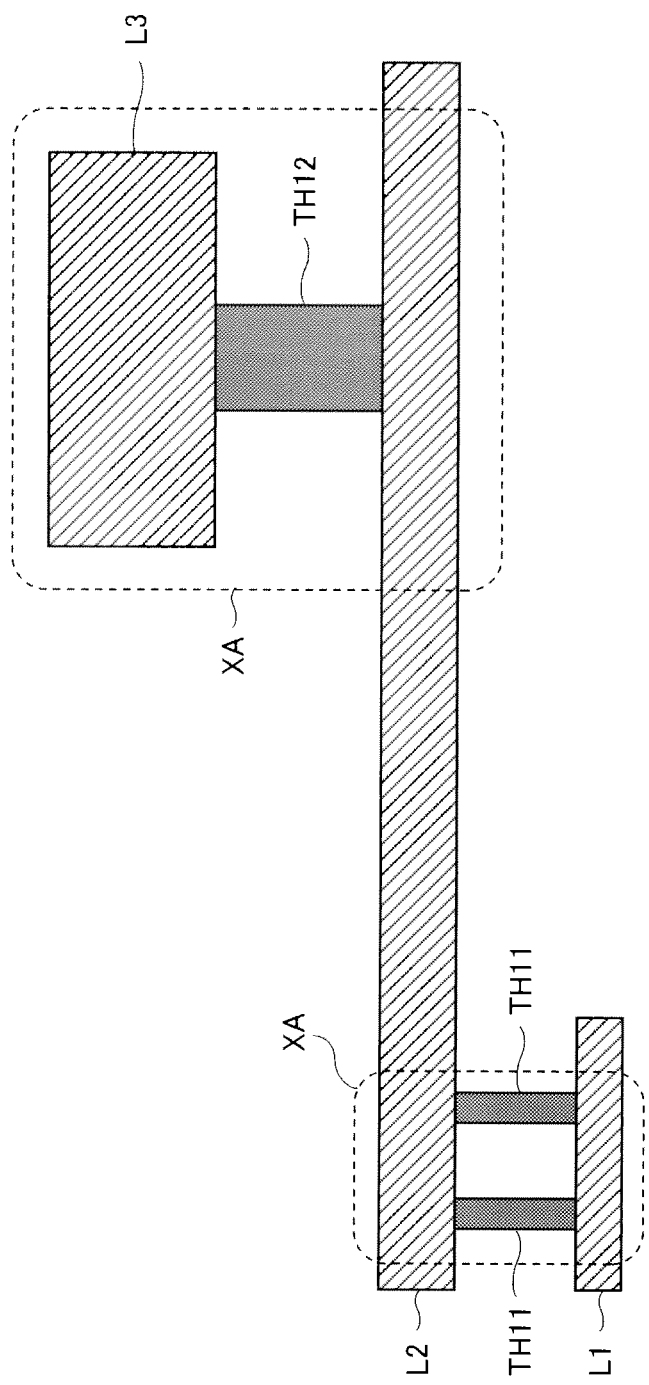
FIG. 31 is a schematic cross-sectional view of a region Z shown in FIG. 30.

FIG. 30 shows an example in which three wiring layers L1 to L3 are used to form the power-supply main lines in a mesh pattern. FIG. 31 is a schematic cross-sectional view of a region Z shown in FIG. 30.

In the example shown in FIG. 30, power-supply mainlines VL1 and SL1, which are formed on the wiring layer L1, and power-supply main lines VL3 and SL3, which are formed on the wiring layer L3, extend in the Y-direction. Power-supply main lines VL2 and SL2, which are formed on the wiring layer L2, extend in the X-direction. The connection between the power-supply main lines VL1 and VL2, and the connection between the power-supply main lines SL1 and SL2 are made via conductor plugs TH1. The connection between the power-supply main lines VL2 and VL3, and the connection between the power-supply main lines SL2 and SL3 are made via conductor plugs TH12. In this manner, the use of the wiring layers L1 and L2 makes it possible to form the power-supply main lines in a mesh pattern. Moreover, the use of the wiring layers L2 and L3 makes it possible to form the power-supply main lines in a mesh pattern.

According to the present embodiment, each power-supply main line is locally enlarged in the intersection regions XA, allowing a larger number of conductor plugs TH11 and TH12 to be disposed.

It is apparent that the present invention is not limited to the above embodiments, but may be modified and changed without departing from the scope and spirit of the invention.

For example, according to the above embodiments, the present invention is applied to the power-supply main lines that are formed in a mesh pattern. However, the application of the present invention is not limited to the power-supply main lines. The present invention may be applied to other wirings such as signal lines.

In addition, while not specifically claimed in the claim section, the applicant reserves the right to include in the claim section of the application at any appropriate time the following methods:

A1. A layout method of a semiconductor device, the method comprising:
defining, on a first layer, a plurality of first and second patterns extending in a first direction, one or more of the second patterns being arranged between adjacent two of the first patterns;
defining, on a second layer, a third pattern extending in a second direction that crosses the first direction;
overlaying the first and second layers to extract a first intersection region from the first patterns where the first and third patterns overlaps with each other;
defining a first enlarged pattern by enlarging one side of the first intersection region that extends in the first direction such that a distance between the first enlarged pattern and the adjacent one of the first pattern is a first minimum space that is a closest distance of adjacent two of the seconds patterns;
obtaining a second enlarged pattern by removing a region from the first enlarged pattern where overlaps with the second patterns and the first minimum space therefrom; and
adding the second enlarged pattern to the first patterns on the first layer.

A2. The layout method of the semiconductor device as described in A1, further comprising:
defining, on the second layer, a plurality of third and fourth patterns extending in the second direction, one or more of the fourth patterns being arranged between adjacent two of the third patterns;
extracting a second intersection region from the third patterns where the first and third patterns overlaps with each other;
defining a third enlarged pattern by enlarging one side of the second intersection region that extends in the second direction such that a distance between the third enlarged pattern and the adjacent one of the third pattern is a second minimum space that is a closest distance of adjacent two of the fourth patterns;
obtaining a fourth enlarged pattern by removing a region from the third enlarged pattern where overlaps with the fourth patterns and the second minimum space therefrom; and
adding the fourth enlarged pattern to the third patterns on the second layer.

A3. The layout method of the semiconductor device as described in A2, wherein the adding the second enlarged pattern is performed by adding a region overlapping with the fourth enlarged pattern.

A4. The layout method of the semiconductor device as described in any one of A1 to A3, wherein in the defining the first enlarged pattern, one side of the first enlarged pattern that extends in the second direction is enlarged by substantially the same distance as one side that extends in the first direction.

A5. The layout method of the semiconductor device as described in any one of A1 to A4, wherein in the obtaining a second enlarged pattern, an isolated pattern that is separated from the first intersection region is also removed.

A6. The layout method of the semiconductor device as described in A3, further comprising defining a plurality of conductor plug patterns that connect the second and fourth enlarged patterns.

A7. The layout method of the semiconductor device as described in any one of A1 to A6, wherein both the first and third patterns are patterns of a power-supply line.

A8. The layout method of the semiconductor device as described in A8, wherein the second patterns are patterns of a signal line.

What is claimed is:
1. A semiconductor device comprising:
a first wiring layer defined on a main surface of a semiconductor substrate;
a second wiring layer defined above the first wiring layer;
an interlayer insulation layer formed between the first and second wiring layers;
first and second lines extending along in a first direction on the first wiring layer;
third and fourth lines extending along in a second direction crossing the first direction on the second wiring layer; and
a plurality of conductor plugs penetrating through the interlayer insulation film, wherein
the first line in the first wiring layer includes a first connection region and a first non-connection region, the third line in the second wiring layer includes a second con- nection region and a second non-connection region, the second connection region in the second wiring layer overlapping the first connection region in the first wiring layer, the plurality of conductor plugs is disposed in the interlayer insulating layer between the first and second connection regions and electrically couples the first and second connection regions, a distance between the first connection region and the second line is smaller than a distance between the first non-connection region and the second line, and a distance between the second connection region and the fourth line is smaller than a distance between the second non-connection region and the fourth line, wherein one of the first and second connection regions is formed into a polygon having five or more sides.

2. The semiconductor device as claimed in claim 1, wherein
the first connection region includes a first main region positioned on an extended portion of the first non-connection region in the first direction and a first enlarged region positioned in a different portion from the extended portion of the first non-connection region in the first direction, and
at least a part of the conductor plug is connected to the first enlarged region.

3. The semiconductor device as claimed in claim 2, wherein
the second connection region includes a second main region positioned on an extended portion of the second non-connection region in the second direction and a second enlarged region positioned in a different portion from the extended portion of the second non-connection region in the second direction, and
at least the part of the conductor plug is connected between the first enlarged region and the second enlarged region.

4. The semiconductor device as claimed in claim 1, wherein both the first and third lines are power-supply lines.

5. The semiconductor device as claimed in claim 4, wherein both the second and fourth lines are signal lines.

6. The semiconductor device as claimed in claim 1, further comprising a plurality of standard cells formed on the semiconductor substrate, wherein
a plurality of the first lines are provided, and
a wiring pitch of the plurality of first lines in the second direction is substantially equal to a width of the plurality of standard cells in the second direction.

7. The semiconductor device as claimed in claim 1, wherein a plurality of the conductor plugs are provided.

8. A semiconductor device comprising:
a plurality of first lines formed on a first wiring layer extending in a first direction;
a plurality of second lines formed on a second wiring layer different from the first wiring layer and extending in a second direction that crosses the first direction; and
a plurality of conductor plugs each connecting an associated one of the first lines on the first wiring layer to an associated one of the second lines on the second wiring layer such that the first and second lines form a mesh-structure wiring, wherein:
the first lines include first enlarged portions at connection positions where the first and second lines cross to each other, a width in the second direction of the first enlarged portions is wider than a line width of the first lines at other than the connection position, and
the second lines include second enlarged portions at the connection positions, a width in the first direction of the second enlarged portions is wider than a line width of the second lines at other than the connection position, wherein at least one of the first and second enlarged portions is formed into a polygon having five or more sides.

9. The semiconductor device as claimed in claim 8, wherein the first and second enlarged portions overlap with each other and are connected through a plurality of conductor plugs.

10. The semiconductor device as claimed in claim 8, wherein the first and second lines include a power-supply line.

11. The semiconductor device as claimed in claim 8, wherein
the first lines are power-supply lines, and
the first wiring layer includes a plurality of third lines that are narrower than the first lines.

12. The semiconductor device as claimed in claim 8, wherein at least one of the first and second enlarged portions includes a concave portion at least on one of the sides that constitute the polygon.

13. The semiconductor device as claimed in claim 8, wherein the mesh-structure wiring is formed above a logic circuit formation region.

14. A semiconductor device comprising:
a plurality of first lines formed on a first wiring layer extending in a first direction;
a plurality of second lines formed on a second wiring layer extending in a second direction that crosses the first direction; and
a plurality of conductor plugs each connecting an associated one of the first lines to an associated one of the second lines such that the first and second lines form a mesh structure wiring,
wherein the first lines include a first polygonal portion that is formed into a polygon having five or more sides at intersection positions where the first and second lines cross to each other.

15. The semiconductor device as claimed in claim 14, wherein the second lines include a second polygonal portion that is formed into a polygon having five or more sides at the intersection positions.

16. The semiconductor device as claimed in claim 15, wherein the first polygonal portion and the second polygonal portion are overlap with each other, and are connected through a plurality of conductor plugs.

17. The semiconductor device as claimed in claim 15, wherein at least one of the first and second polygonal portions includes a concave portion at least on one of the sides that constitute the polygon.

18. The semiconductor device as claimed in claim 14, wherein the first and second lines include a power-supply line.

19. The semiconductor device as claimed in claim 14, wherein
the first lines are power-supply lines, and
the first wiring layer includes a plurality of third lines that are narrower than the first lines.

20. The semiconductor device as claimed in claim 14, wherein the mesh-structure wiring is formed above a logic circuit formation region.

* * * * *